(12) United States Patent
Kamon

(10) Patent No.: US 7,978,912 B2
(45) Date of Patent: Jul. 12, 2011

(54) IMAGE SENSING APPARATUS AND IMAGE SENSING METHOD

(75) Inventor: Koichi Kamon, Otokuni-gun (JP)

(73) Assignee: Konica Minolta Holdings, Inc., Tokyo (JP)

( * ) Notice: Subject to any disclaimer, the term of this patent is extended or adjusted under 35 U.S.C. 154(b) by 679 days.

(21) Appl. No.: 12/104,705

(22) Filed: Apr. 17, 2008

(65) Prior Publication Data

US 2008/0260298 A1     Oct. 23, 2008

(30) Foreign Application Priority Data

Apr. 19, 2007   (JP) .................... 2007-110753

(51) Int. Cl.
*G06K 9/00* (2006.01)
(52) U.S. Cl. .................. 382/167; 382/162; 382/321
(58) Field of Classification Search .......... 382/167, 382/162, 274, 321; 348/254, 362, 222.1, 348/E5.031; 257/E27.134; 399/49; 358/300, 358/443
See application file for complete search history.

(56) References Cited

U.S. PATENT DOCUMENTS

| | | | | |
|---|---|---|---|---|
| 5,539,532 A | * | 7/1996 | Watanabe | 358/443 |
| 5,822,079 A | * | 10/1998 | Okuno et al. | 358/300 |
| 6,831,695 B1 | * | 12/2004 | Tamayama | 348/362 |
| 2006/0001061 A1 | | 1/2006 | Miyatake et al. | 257/292 |

FOREIGN PATENT DOCUMENTS

| | | | |
|---|---|---|---|
| JP | 02170674 | * | 7/1990 |
| JP | 2006-50544 A | | 2/2006 |

* cited by examiner

*Primary Examiner* — Anh Hong Do
(74) *Attorney, Agent, or Firm* — Sidley Austin LLP

(57) ABSTRACT

An image sensing apparatus is configured such that the level of each of first and second output signals obtained by exposing a color image sensor by using mutually differing first and second photoelectric conversion properties is compared with one of threshold values to thereby select output signals to be used as signals for constituting an image from among the first and second output signals for individual color components thereof. The threshold values are set for the individual color components based on the first and second output signals.

15 Claims, 19 Drawing Sheets

PRIOR ART

IMAGE SENSING APPARATUS AND IMAGE SENSING METHOD

This application is based on Japanese Patent Application No. 2007-110753 filed on Apr. 19, 2007, the contents of which are hereby incorporated by reference.

BACKGROUND OF THE INVENTION

1. Field of the Invention

The present invention relates to an image sensing apparatus and an image sensing method for picking up an image through a process of photoelectrically converting received light into an electric signal.

2. Description of the Related Art

An example of a prior art approach to which the invention is directed is found in Japanese Unexamined Patent Publication No. 2006-50544 which proposes an image sensor configured to perform both linear conversion operation and logarithmic conversion operation. The linear conversion operation is a photoelectric conversion process for integrating electric charges generated by exposure up to a point where a specified amount of light exposure (or the amount of incident light which is hereinafter referred to as a threshold value) is reached and converting a value of integration of the exposure-induced electric charges into a voltage proportional to the value of integration of the exposure-induced electric charges. The logarithmic conversion operation is a photoelectric conversion process for converting the amount of light exposure into a logarithmically compressed voltage without integrating the exposure-induced electric charges after the amount of light exposure has exceeded the aforementioned threshold value.

When this kind of image sensor is used in linear conversion mode, the image sensor produces an output proportional to the amount of electric charge generated by each pixel. Although operation in the linear conversion mode is advantageous in that the image sensor outputs an image signal with high contrast (high gradation performance) even when a subject has low brightness, the image sensor has a narrower dynamic range. On the other hand, operation in logarithmic conversion mode is advantageous in that a wide dynamic range is obtained as the image sensor produces an output derived from the amount of incident light through conversion by using a natural logarithm in this mode of operation. The logarithmic conversion operation however has a drawback in that the output image signal has poor contrast since the image signal is logarithmically compressed.

FIG. 16 is a diagram showing a situation in which a subject sensed by a particular pixel of an image sensor varies from a high-brightness subject to a low-brightness subject during an exposure period as the subject moves in an arrow direction relative to the particular pixel.

If the subject varies from a high-brightness subject to a low-brightness subject having approximately zero brightness during the exposure period as shown in FIG. 16, color fringing occurs in an image obtained by an image sensing apparatus employing this kind of image sensor. This phenomenon of color fringing is explained in detail hereinbelow assuming preconditions (1) to (7) below:

(1) The image sensor is provided with a plurality of color filters which allow light of different wavelength ranges (colors) to pass through and individual pixels of the image sensor have varying sensitivities for the different colors;

(2) For the purpose of the following discussion, two cases are assumed, that is, a case where the aforementioned particular pixel is a pixel provided with a color filter for a first color (hereinafter referred to as the first color pixel) and a case where the aforementioned particular pixel is a pixel provided with a color filter for a second color (hereinafter referred to as the second color pixel);

(3) The first color pixel has a higher sensitivity than the second color pixel;

(4) Exposure time within an exposure period is a relatively long period of time;

(5) Each of "pixel values" hereinafter referred to includes not only a value of a pixel signal output from a pixel but also a signal value corresponding to an electric charge generated by the photoelectric conversion process performed in the pixel;

(6) The high-brightness subject and the low-brightness subject each have uniform brightness throughout an entire area of the subject; and (7) The high-brightness subject is assumed to take one of two forms, that is, a subject having relatively high brightness among subjects classified as high-brightness subjects (hereinafter referred to as the first high-brightness subject) and a subject having relatively low brightness among the subjects classified as the high-brightness subjects (hereinafter referred to as the second high-brightness subject), wherein the first and second high-brightness subjects are of the same color.

FIG. 17 is a graph showing an example of how the amount of incident light (instantaneous value) varies with time T elapsed from the beginning of exposure (time T=0) of the particular pixel when the subject varies from the high-brightness subject to the low-brightness subject as mentioned above. The example of FIG. 17 indicates that the subject varies from the high-brightness subject to the low-brightness subject at time T1 (T=T1) and exposure is finished at time T2 (T=T2), wherein time T1 is referred to as brightness change timing.

Designated by the symbol A1 in FIG. 17 is a tracing of the instantaneous amount of incident light obtained when the subject is a high-brightness subject classified as the first high-brightness subject. As can be seen from the tracing A1, a constant amount of incident light L1 hits the particular pixel from the beginning of exposure to the brightness change timing T1 at which the amount of incident light L drops approximately to a zero level almost instantaneously, and during a period from the brightness change timing T1 to a point of end-of-exposure timing T2, the amount of incident light L remains approximately to the zero level. Designated by the symbol A2 in FIG. 17 is a tracing of the instantaneous amount of incident light obtained when the subject is a high-brightness subject classified as the second high-brightness subject. It can be seen from FIG. 17 that the tracing A2 shows almost the same pattern as the tracing A1 obtained with the first high-brightness subject except that the amount of incident light L on the particular pixel is L2 which is smaller than L1 (L2<L1) from the beginning of exposure to the brightness change timing T1.

Discussed next with reference to graphs of FIGS. 18 and 19 is how pixel values obtained by the first color pixel and the second color pixel vary with time T. Designated by the symbols G2 and B2 in FIG. 18 are tracings of the pixel values through the lapse of time T obtained by the first and second color pixels, respectively, when the subject is a high-brightness subject classified as a second high-brightness subject. Also, designated by the symbols G3 and B3 in FIG. 19 are tracings of the pixel values through the lapse of time T obtained by the first and second color pixels, respectively, when the subject is a high-brightness subject classified as the first high-brightness subject.

The conventional image sensor discussed here has capability to operate the individual pixels in the aforementioned linear conversion mode and logarithmic conversion mode. Specifically, as depicted in FIGS. 18 and 19, the image sensor causes the individual pixels to perform photoelectric conversion in the linear conversion mode in which each pixel produces a pixel value proportional to an accumulated amount of incident light from the beginning of exposure while the accumulated amount of incident light is smaller than a specific reference value (threshold value) of the accumulated amount of incident light, whereas the image sensor causes the individual pixels to perform photoelectric conversion in the logarithmic conversion mode in which each pixel produces a pixel value obtained by logarithmically compressing the instantaneous amount of incident light when the accumulated amount of incident light becomes equal to or larger than the reference value thereof. Designated by the symbol S1 in FIGS. 18 and 19 is a pixel value of a pixel signal produced by a pixel when the accumulated amount of incident light becomes equal to the reference value thereof. This pixel value is hereinafter referred to as a threshold value S1. In the graphs of FIGS. 18 and 19, a region in which the pixel value is smaller than the threshold value S1 is referred to as a linear conversion region and a region in which the pixel value is equal to or larger than the threshold value S1 is referred to as a logarithmic conversion region.

As depicted in FIG. 18, the pixel value produced by either of the first and second color pixels increases at approximately a constant rate in proportion to the exposure time during a particular time duration within the exposure period while the image sensor picks up an image of the high-brightness subject. Also, since the second color pixel has a higher sensitivity than the first color pixel, the pixel value produced by the first color pixel increases at a higher rate than the pixel value produced by the second color pixel. Accordingly, the pixel values of the first and second color pixels vary as shown by the tracings G2 and B2 in FIG. 18, respectively.

Also, when the high-brightness subject is a second high-brightness subject, the pixel values of both the first and second color pixels increase at relatively low rates so that the brightness change timing T1 is reached before the pixel values exceed the aforementioned threshold value S1. Designated by the symbol S2 in FIG. 18 is the pixel value of the first color pixel and designated by the symbol S3 is the pixel value of the second color pixel at the brightness change timing T1. The amount of incident light on either of the first and second color pixels becomes approximately zero at and beyond the brightness change timing T1 so that the pixel values S2 and S3 of the first and second color pixels remain almost unchanged from the brightness change timing T1 to the end-of-exposure timing T2 (as represented by flat portions of the tracings G2 and B2 in FIG. 18) This means that the particular pixel operates only in the linear conversion region during the exposure period, and the pixel value of the pixel signal output from the particular pixel after the end-of-exposure timing T2 becomes S2 when the particular pixel is a first color pixel whereas the pixel value of the pixel signal output from the particular pixel after the end-of-exposure timing T2 becomes S3 when the particular pixel is a second color pixel.

On the other hand, if the subject is a high-brightness subject classified as a first high-brightness subject, the pixel value produced by either of the first and second color pixels increases at approximately a constant rate in proportion to the exposure time during a particular time duration within the exposure period while the image sensor picks up an image of the high-brightness subject as depicted in FIG. 19. Also, since the second color pixel has a higher sensitivity than the first color pixel, the pixel value produced by the first color pixel increases at a higher rate than the pixel value produced by the second color pixel. Accordingly, the pixel values of the first and second color pixels vary as shown by the tracings G3 and B3 in FIG. 19, respectively.

Also, when the high-brightness subject is a first high-brightness subject, the pixel values of both the first and second color pixels increase at a high rate as compared to a case where the high-brightness subject is a second high-brightness subject as depicted in FIG. 19. However, the brightness change timing T1 is reached before the pixel value of the second color pixel exceeds the aforementioned threshold value S1. Designated by the symbol S3' in FIG. 19 is the pixel value of the second color pixel at the brightness change timing T1. The amount of incident light on the second color pixel becomes approximately zero at and beyond the brightness change timing T1 so that the pixel value S3' of the second color pixel remains almost unchanged from the brightness change timing T1 to the end-of-exposure timing T2. This means that the particular pixel operates only in the linear conversion region during the exposure period if the particular pixel is a second color pixel.

In contrast, the pixel value of the first color pixel reaches the threshold value S1 at a point of timing Ts before the brightness change timing T1 is reached. Therefore, the particular pixel acting as the first color pixel performs the logarithmic conversion operation from the timing Ts to the brightness change timing T1, so that the particular pixel (first color pixel) produces a value obtained by logarithmically processing the amount of incident light as the pixel value. As a consequence, the pixel value of the first color pixel instantaneously increases to a value S2' at the timing Ts and this pixel value S2' remains unchanged up to the brightness change timing T1 as shown in FIG. 19 since the amount of incident light is constant during this period.

In this case, there arises a problem which is described below. The aforementioned logarithmic conversion region is a region in which the particular pixel produces a pixel value obtained by logarithmically processing the amount of incident light without integrating the amount of incident light or exposure-induced electric charge. Therefore, the pixel value of the first color pixel drops from S2' at a point of the brightness change timing T1 when the amount of incident light becomes approximately zero. Since the first color pixel holds an accumulated electric charge corresponding to the aforementioned threshold value S1 at this point, the pixel value of the first color pixel drops down to S1 at the timing T1, and this drop in the pixel value occurs instantaneously. Then, the pixel value output from the first color pixel after the point of end-of-exposure timing T2 remains at S1. As the pixel value output from the first color pixel becomes S1, and not S2', as described above, there occurs color fringing in an image produced by the image sensor.

The ratio (S3'/S3) of the pixel value S3' of the pixel signal obtained from the second color pixel when the high-brightness subject is a first high-brightness subject to the pixel value S3 of the pixel signal obtained from the second color pixel when the high-brightness subject is a second high-brightness subject coincides with the ratio (L1/L2) of the amount of incident light L1 to the amount of incident light L2 shown in FIG. 17.

On the other hand, the pixel value of the pixel signal expected to be naturally output from the first color pixel upon completion of exposure is a pixel value S2" shown in FIG. 19 which would be obtained at the point of the brightness change timing T1 if the first color pixel were to perform the linear conversion operation, and not the logarithmic conversion operation, even during a period from the timing Ts to the brightness change timing T1. This pixel value S2" is the pixel value obtained by the photoelectric conversion process performed during the period from the timing Ts to the brightness change timing T1. The ratio (S2"/S2) of the pixel value S2" expected to be naturally obtained from the first color pixel when the high-brightness subject is a first high-brightness subject to the pixel value S2 of the pixel signal obtained from the first color pixel when the high-brightness subject is a second high-brightness subject coincides with the ratio (L1/L2) of the amount of incident light L1 to the amount of incident light L2 shown in FIG. 17.

Among the aforementioned pixel values S2, S2", S3 and S3', there is a relationship expressed by equation S2"/S2=S3'/S3=L1/L2 from which a relationship expressed by equation S2/S3=S2"/S3' is derived. If white balance is adjusted based on the ratio between the pixel value of an output signal of the first color pixel and an output signal of the second color pixel, the relationship expressed by S2/S3=S2"/S3' is obtained so that the high-brightness subject is presented by the same color regardless of whether the high-brightness subject is a first high-brightness subject or a second high-brightness subject.

However, the pixel value of the pixel signal actually obtained from the first color pixel when the high-brightness subject is a first high-brightness subject becomes equal to the threshold value S1 (≠S2") which does not reflect the result of photoelectric conversion performed from the timing Ts to the brightness change timing T1. Therefore, the ratio S1/S3' of this pixel value S1 to the pixel value S3' of the pixel signal obtained from the second color pixel when the high-brightness subject is a first high-brightness subject does not coincide with the ratio S2/S3 of the pixel value S2 to the pixel value S3 which are obtained from the first and second color pixels, respectively, when the high-brightness subject is a second high-brightness subject. It follows that the high-brightness subject is presented in different colors depending on whether the high-brightness subject is a first high-brightness subject or a second high-brightness subject, thereby causing a color fringing problem.

SUMMARY OF THE INVENTION

In view of the above, it is an object of the invention to provide an image sensing apparatus and an image sensing method which make it possible to prevent color fringing.

According to an image sensing apparatus and an image sensing method of the invention, the level of each of first and second output signals obtained by exposing a color image sensor by using mutually differing first and second photoelectric conversion properties is compared with one of threshold values to thereby select output signals to be used as signals for constituting an image from among the first and second output signals for individual color components thereof, wherein the threshold values are set for the individual color components based on the first and second output signals. For example, the threshold values are set for the individual color components according to correction coefficients used for correcting white balance of the first and second output signals. The image sensing apparatus and the image sensing method thus configured make it possible to prevent or reduce color fringing caused by differences in the sensitivities of the individual pixels and, in particular, color fringing caused when a subject transfers from a high-brightness subject to a low-brightness subject during a single exposure period. It is therefore possible to obtain an image reproducing more faithfully the subject.

These and other objects, features and advantages of the invention will become more apparent upon a reading of the following detailed description in conjunction with the accompanying drawings.

DETAILED DESCRIPTION OF THE PREFERRED EMBODIMENTS OF THE INVENTION

Figure 1:
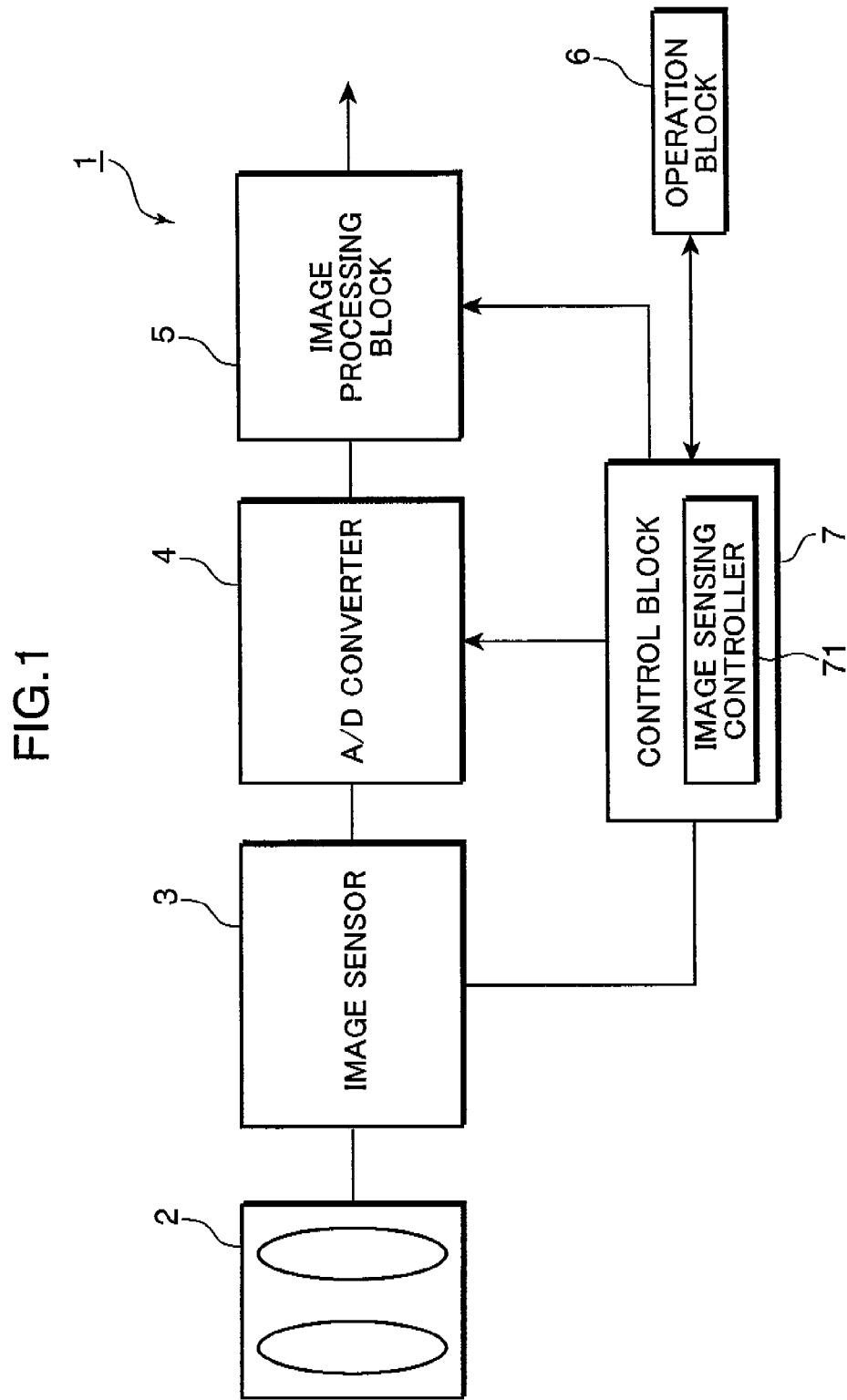
FIG. 1 is a block diagram of an image sensing apparatus according to a first embodiment of the invention.

The invention is now described in detail with reference to the accompanying drawings in which like reference numerals designate like elements.

First Embodiment

FIG. 1 is a block diagram showing the configuration of an image sensing apparatus 1 according to a first embodiment of the invention. As shown in FIG. 1, the image sensing apparatus 1 comprises an optical system 2, an image sensor 3, an analog-to-digital (A/D) converter 4, an image processing block 5, an operation block 6 and a control block 7.

Although not illustrated in detail, the optical system 2 includes a zoom lens for varying magnifying power (focal length), a focusing lens for adjusting a focal point and an iris diaphragm for adjusting the amount of incident light hitting the image sensor 3. The zoom lens, the focusing lens and the iris diaphragm are held in line along an optical axis in a tube. The optical system 2 thus configured serves to take in an optical image of a subject and focus the optical image on the image sensor 3.

The image sensor 3 includes a plurality of pixels which are arranged in a two-dimensional matrix and provided with red (R), green (G) and blue (B) color filters having different spectral characteristics arranged at a ratio of 1:2:1. The image sensor 3 thus configured serves as a color area sensor which performs a photoelectric conversion process to convert the amount of light picked up from the subject and guided by the optical system 2 onto the image sensor 3 into image signals representative of RGB components of the incident light and outputs the image signals. In the following discussion of the present embodiment, the pixels provided with the red (R) color filters, the pixels provided with the green (G) color filters and the pixels provided with the blue (B) color filters are referred to as the R pixels, the G pixels and the B pixels, respectively, and it is assumed that the G, R and B pixels have progressively lower sensitivities in this order.

Figure 2:
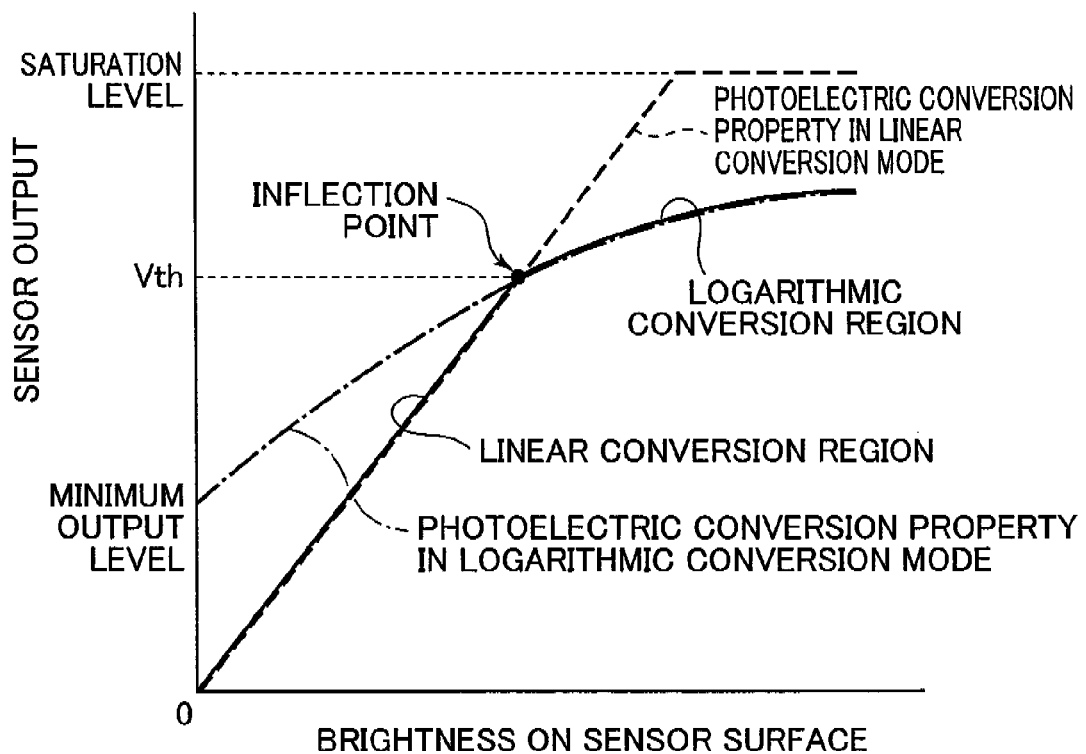
FIG. 2 is a graph showing an example of photoelectric conversion properties of an image sensor of the image sensing apparatus.

As shown in FIG. 2, the image sensor 3 used in this embodiment is a solid-state image sensor which has photoelectric conversion properties involving a linear conversion region and a logarithmic conversion region. In the linear conversion region, the image sensor 3 performs photoelectric conversion to linearly convert the amount of incident light into electric signals when illuminance on a sensor surface of the image sensor 3 (or brightness on the sensor surface) is low. In the logarithmic conversion region, the image sensor 3 performs photoelectric conversion to logarithmically convert (logarithmically compress) the amount of incident light into electric signals when the illuminance on the sensor surface is high. In short, the image sensor 3 is a logarithmic conversion type solid-state image sensor having photoelectric conversion properties which include linear conversion mode used on a low-brightness side and logarithmic conversion mode used on a high-brightness side. The image sensor 3 is configured to provide capability to controllably set a switching point (inflection point) Vth between the linear conversion mode and the logarithmic conversion mode of the photoelectric conversion properties according to specific control signals for controlling individual pixel circuits of the image sensor 3.

In this embodiment, the image sensor 3 is controlled such that, when operated in the linear conversion mode, all the pixels output image sensing signals obtained through linear conversion with the inflection point Vth set at a level equal to or higher than a pixel value reached when each pixel is in a saturated state (this level is hereinafter referred to as the saturation level) and, when operated in the logarithmic conversion mode, all the pixels output image sensing signals obtained through logarithmic conversion with the inflection point Vth set at a level equal to or lower than a minimum output level.

As an example, the image sensor 3 is a metal oxide semiconductor (MOS) type solid-state image sensor configured with a plurality of pixels arranged in a form of matrix, each of the pixels including a photoelectric cell, a p-type (or n-type) metal-oxide-semiconductor field-effect transistor (MOSFET) and a floating diffusion (FD) region. The image sensor 3 is a so-called X-Y address type complementary metal-oxide-semiconductor (CMOS) image sensor The image sensor 3 thus configured outputs pixel signals having a linear property (i.e., linear outputs) or pixel signals having a logarithmic property (i.e., logarithmic outputs) from FD regions of the individual pixels by varying a transfer gate potential of a transfer transistor or reset gate potential of a reset transistor of the aforementioned MOSFET of each pixel, for example. It is to be pointed out that the image sensor 3 is not limited to this configuration but may be a threshold voltage modulation image sensor (VMIS) or a charge-coupled device (CCD) image sensor, for example.

Figure 3:
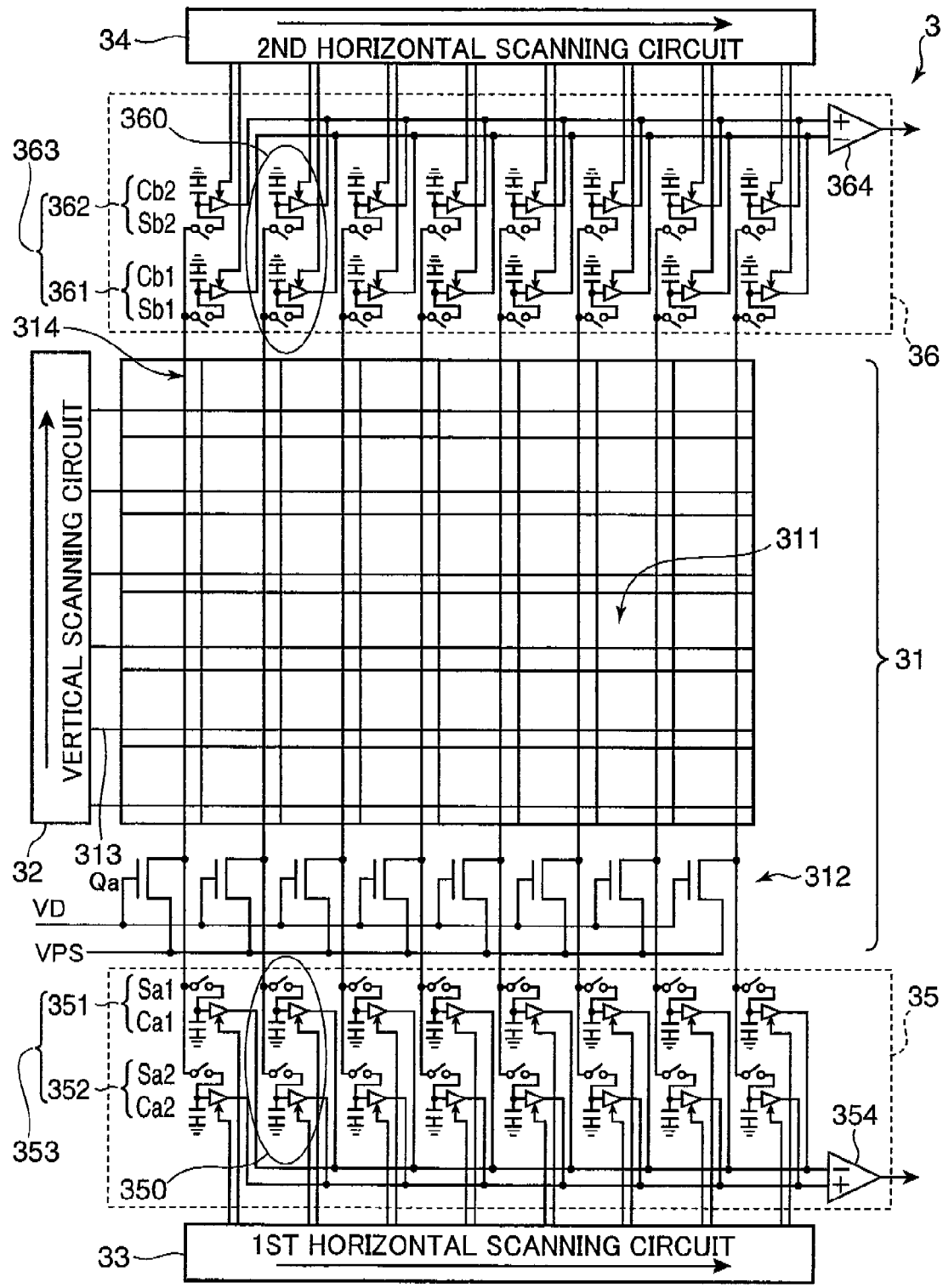
FIG. 3 is a diagram showing an example of the circuit configuration of the image sensor.

More particularly, the image sensor 3 has a circuit configuration shown in FIG. 3. As depicted in FIG. 3, the image sensor 3 includes a pixel array 31, a vertical scanning circuit 32, a first horizontal scanning circuit 33, a second horizontal scanning circuit 34, a first readout circuit 35 and a second readout circuit 36. The pixel array 31 includes a plurality of pixels 311 which produce image signals having the aforementioned linear property or logarithmic property through photoelectric conversion of the amount of light of the optical image of the subject and output the image signals thus produced. The pixel array 31 further includes a load circuit 312 configured with load transistors Qa each of which functions as a so-called electronic load when a load voltage (signal VD) is applied to a gate.

The vertical scanning circuit 32 is a vertical shift register for performing vertical scanning through the individual pixels 311 of the pixel array 31 by successively scanning through individual row select signal lines 313. Vertical scanning is executed through all successive pixel rows of the pixel array 31. The first horizontal scanning circuit 33 and the second horizontal scanning circuit 34 are horizontal shift registers for performing horizontal scanning through the individual pixels 311 by successively scanning through individual vertical signal lines (column select signal lines, or output signal lines) 314. Column select operation is performed on the individual pixels 311 of the pixel array 31. In this image sensor 3, the first horizontal scanning circuit 33 makes horizontal scanning through the linear outputs from the individual pixels 311 whereas the second horizontal scanning circuit 34 makes horizontal scanning through the logarithmic outputs (logarithmically compressed outputs) from the individual pixels 311.

The first readout circuit 35 is a circuit for successively reading out image signals represented by the linear outputs taken out from one pixel 311 after another in each of the pixel rows scanned by the vertical scanning circuit 32 through the vertical signal lines 314 in pace with the progress of horizontal scanning performed by the first horizontal scanning circuit 33. Similarly, the second readout circuit 36 is a circuit for successively reading out image signals represented by the logarithmic outputs taken out from one pixel 311 after another in each of the pixel rows scanned by the vertical scanning circuit 32 through the vertical signal lines 314 in pace with the progress of horizontal scanning performed by the second horizontal scanning circuit 34. The image sensor 3 of this embodiment is provided with the first and second readout circuits 35, 36 dedicated to reading out the image signals obtained from the individual pixels 311 with different photoelectric conversion properties as mentioned above. Specifically, the image sensor 3 is provided with the first and second readout circuits 35, 36 dedicated to reading out the linear outputs and the logarithmic outputs, respectively. The first and second readout circuits 35, 36 serve as so-called sample-and-hold circuits to capture and retain "samples" of the image signals obtained from the linear outputs and logarithmic outputs as well as noise signals.

The first readout circuit 35 is provided with a sample-and-hold circuit 353 for the linear outputs which includes signal sample-and-hold circuits 351 having signal sample-and-hold switches Sa1 and signal sample-and-hold capacitors Ca1 and noise sample-and-hold circuits 352 having noise sample-and-hold switches Sa2 and noise sample-and-hold capacitors Ca2. The signal sample-and-hold circuits 351 and the noise sample-and-hold circuits 352 of the first readout circuit 35 sample input analog signals (image signals) and noise (noise signals), respectively, and temporarily hold values of the input image and noise signals. Similarly, the second readout circuit 36 is provided with a sample-and-hold circuit 363 for the logarithmic outputs which includes signal sample-and-hold circuits 361 having signal sample-and-hold switches Sb1 and signal sample-and-hold capacitors Cb1 and noise sample-and-hold circuits 362 having noise sample-and-hold switches Sb2 and noise sample-and-hold capacitors Cb2. The signal sample-and-hold circuits 361 and the noise sample-and-hold circuits 362 of the second readout circuit 36 sample input image and noise signals and temporarily hold values thereof, respectively.

The first and second readout circuits 35, 36 are further provided with differential amplifiers 354, 364 (analog amplifiers), respectively. These amplifiers 354, 364 serve to remove noise components occurring due to variations in sensitivities of the individual pixels 311 and amplify the signals output from the individual pixels 311 in analog form using analog gains. The amplifiers 354, 364 output gain-adjusted linear and logarithmic image data (image signals) from which the noise components have been removed to the A/D converter 4 which is a processing circuit provided in a succeeding stage. A combination of one each signal sample-and-hold circuit 351 and noise sample-and-hold circuit 352 is referred to as a vertical output circuit 350, whereas a combination of one each signal sample-and-hold circuit 361 and noise sample-and-hold circuit 362 is referred to as a vertical output circuit 360.

Figure 4:
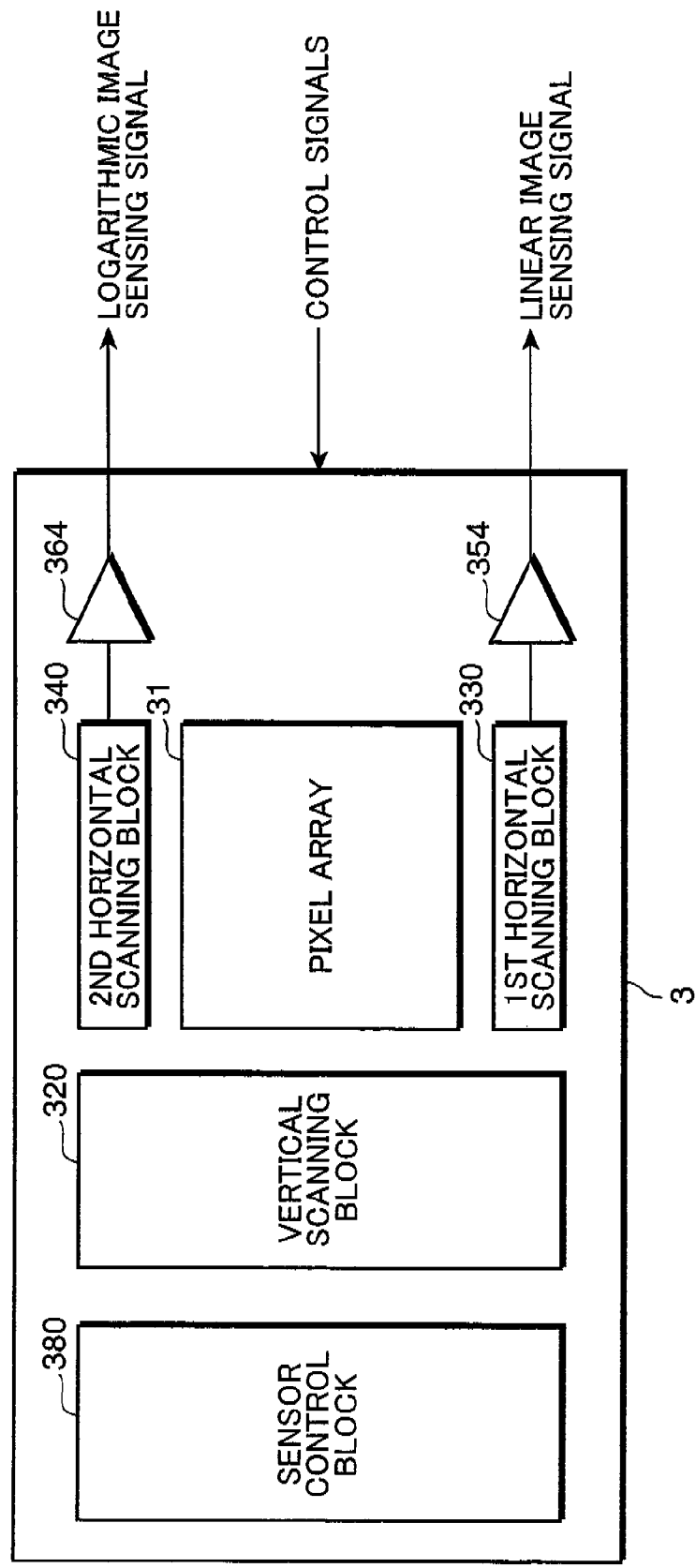
FIG. 4 is a block diagram of the image sensor of which photoelectric conversion properties provide linear conversion mode and logarithmic conversion mode.

FIG. 4 is a block diagram generally showing the electrical configuration of the image sensor 3. As shown in FIG. 4, the image sensor 3 includes the aforementioned pixel array 31 depicted in FIG. 3, a vertical scanning block 320 corresponding to the aforementioned vertical scanning circuit 32, a first horizontal scanning block 330 corresponding to the aforementioned first horizontal scanning circuit 33 and first readout circuit 35 (not including the amplifier 354), a second horizontal scanning block 340 corresponding to the aforementioned second horizontal scanning circuit 34 and second readout circuit 36 (not including the amplifier 364), the aforementioned amplifiers 354, 364, and a sensor control block 380 including first and second amplification factor controllers 381, 382.

The image sensor 3 of this embodiment performs exposure in the linear conversion mode and the logarithmic conversion mode for each successive pixel row (horizontal scanning line) and outputs image sensing signals obtained with the respective photoelectric conversion properties through different output circuits (amplifiers 354, 364). The image sensor 3 performs image sensing operation according to control signals (i.e., first and second amplification factor control signals, timing signal, etc.) externally input from the image processing block 5 or the operation block 6 and outputs the image sensing signals obtained with the respective photoelectric conversion properties. From the image sensing signals obtained through photoelectric conversion by the pixel array 31, the vertical scanning block 320 selects image signals obtained with the respective photoelectric conversion properties for each successive horizontal scanning line (pixel signals derived from the pixels 311 in a pixel row corresponding to each successive horizontal scanning line) and outputs the same to the first horizontal scanning block 330 and the second horizontal scanning block 340 which hold the input image signals. The image sensing signals obtained with the different photoelectric conversion properties held in the first and second horizontal scanning blocks 330, 340 are amplified by the respective amplifiers 354, 364 for the individual pixels 311. Then, the amplifier 354 outputs linear image sensing signals and the amplifier 364 outputs logarithmic image sensing signals. Amplification factors of the amplifiers 354, 364 are individually set by the sensor control block 380 according to the aforementioned externally input control signals. Also, the sensor control block 380 controls amplifying operation performed by the amplifiers 354, 364, photoelectric conversion operation performed by the pixel array 31, vertical scanning operation performed by the vertical scanning block 320, and horizontal scanning operation performed by the first and second horizontal scanning blocks 330, 340.

Returning to FIG. 1, the A/D converter 4 performs an A/D conversion process to convert the analog-valued image signals (analog signals) amplified by the amplifiers 354, 364 of the image sensor 3 into digital-valued image signals (hereinafter referred to as pixel data). The image processing block 5 performs later-described image processing operation on the pixel data output from the A/D converter 4. Although not illustrated, the operation block 6 includes a power on/off button used for turning on and off the image sensing apparatus 1, a shutter button used for entering a command indicating a timing of exposure of the image sensor 3, a dial and/or a button used for selecting one of modes or functions, such as image sensing mode for taking a still picture or a motion picture and replay mode for reproducing a recorded picture, provided in the image sensing apparatus 1, and a dial and/or a button used for entering a command for entering such image sensing conditions as diaphragm opening, shutter speed and flashlight on/off settings. The operation block 6 delivers information on these operating conditions to the control block 7.

The control block 7 includes a read-only memory (ROM) for storing control programs, a random access memory (RAM) for temporarily storing data and a central processing unit (CPU) which reads out the control programs from the ROM and execute the control programs. The control block 7 thus configured controls the working of the image sensor 3, the A/D converter 4 and the image processing block 5 in an interrelated fashion according to the information on the operating conditions fed from the operation block 6. The control block 7 functionally includes an image sensing controller 71 for controlling the image sensing operation of the image sensor 3.

Figure 5:
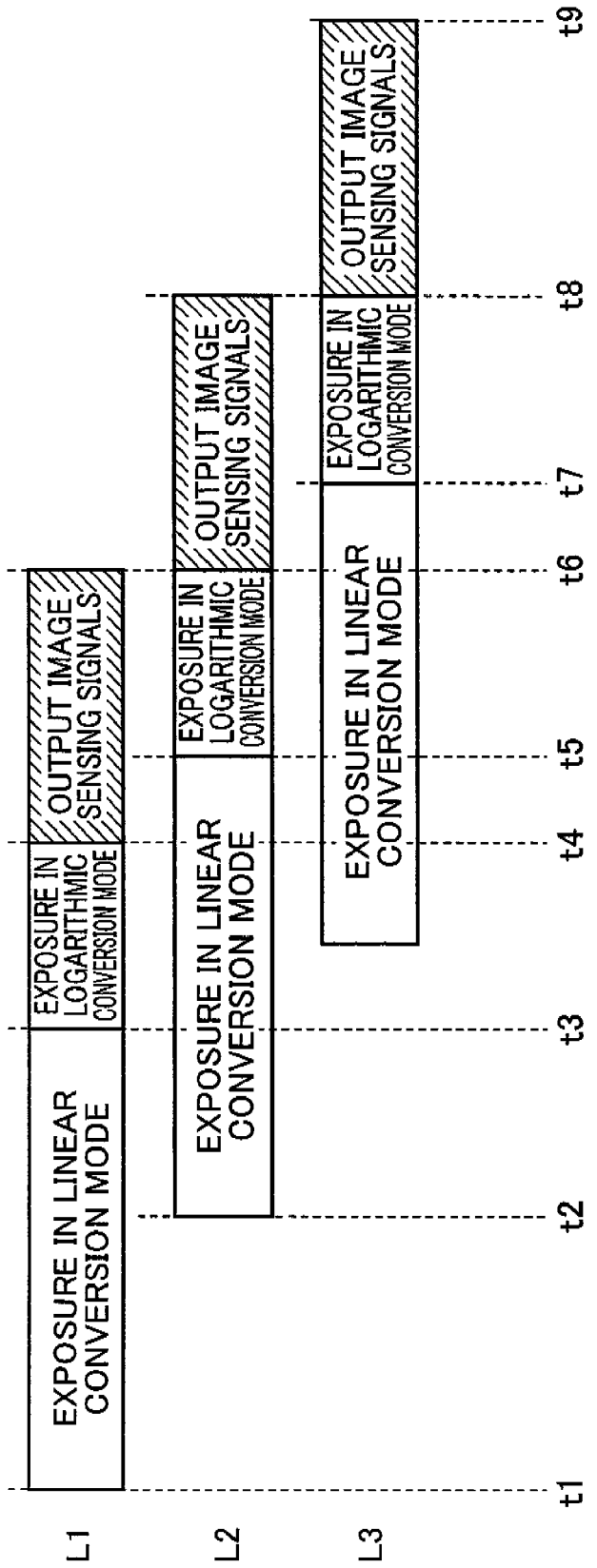
FIG. 5 is a diagram schematically showing exposure and image sensing signal output timings in the linear and logarithmic conversion modes

FIG. 5 is a diagram schematically showing exposure and image sensing signal output (readout) timings in the individual photoelectric conversion modes (linear and logarithmic conversion modes) for each successive horizontal scanning line of the image sensor 3.

Here, the working of the image sensor 3 is described taking into consideration three successive horizontal scanning lines L1 to L3 shown in FIG. 5. First in the horizontal scanning line L1, exposure begins in the linear conversion mode, and at the end of a specific exposure time (period t1-t3), an image signal obtained by exposure in the linear conversion mode is output to the first horizontal scanning block 330 and held therein. Next, exposure is performed in the logarithmic conversion mode, and at the end of a specific exposure time (period t3-t4), an image signal obtained by exposure in the logarithmic conversion mode is output to the second horizontal scanning block 340 and held therein. Then, the image signals obtained in the linear and logarithmic conversion modes are read out from the first and second horizontal scanning blocks 330, 340 and amplified by the amplifiers 354, 364 at specific amplification factors, and the amplifiers 354, 364 output the linear and logarithmic image sensing signals, respectively (period t4-t6).

In this embodiment, the pixel signals obtained in the linear conversion mode and the pixel signals obtained in the logarithmic conversion mode are separately output from the first and second horizontal scanning blocks 330, 340 and separately A/D-converted by the A/D converter 4.

Subsequently, exposure and image sensing signal output (readout) control operations for the horizontal scanning lines L2 and L3 are performed in succession in essential the same way as described above, whereby image signals obtained from the horizontal scanning lines L2 and L3 are output. Specifically, following the aforementioned image sensing signal output period t4-t6 for the horizontal scanning line L1, the image signals obtained from the horizontal scanning line L2 are output during an image sensing signal output period t6-t8 for the horizontal scanning line L2, and the image signals obtained from the horizontal scanning line L3 are output during an image sensing signal output period t8-t9 for the horizontal scanning line L3 in succession. The above-described sequence of exposure in the linear conversion mode, exposure in the logarithmic conversion mode and image sensing signal output (readout) control operations is carried out for one horizontal scanning line after another to cover all the horizontal scanning lines (pixel rows) of the pixel array 31.

Figure 6:
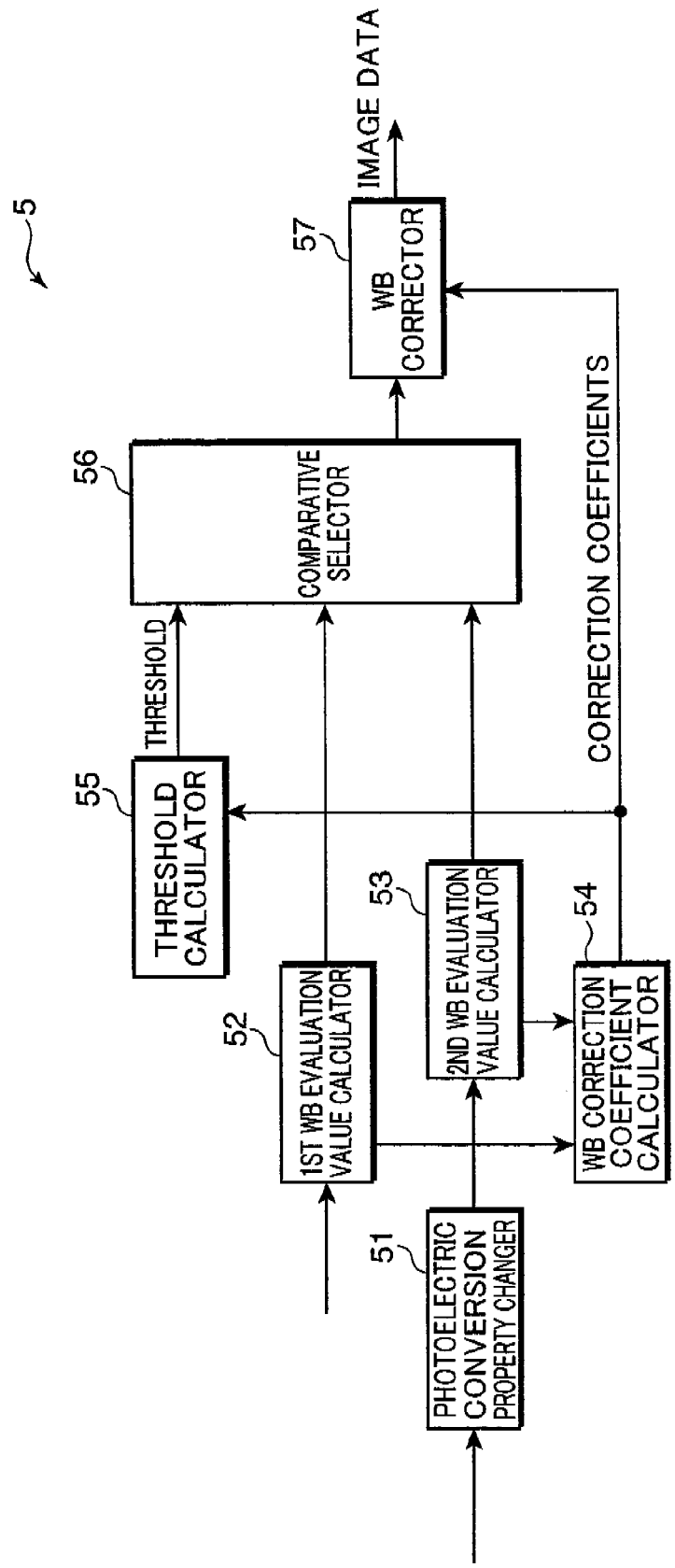
FIG. 6 is a block diagram showing the electrical configuration of an image processing block of the image sensor according to the first embodiment.

FIG. 6 is a block diagram generally showing the electrical configuration of the image processing block 5. As shown in FIG. 6, the image processing block 5 includes a photoelectric conversion property changer 51, a first white balance evaluation value calculator 52, a second white balance evaluation value calculator 53, a white balance correction coefficient calculator 54, a threshold calculator 55, a comparative selector 56 and a white balance corrector 57.

The photoelectric conversion property changer 51 performs operation for converting pixel data obtained in the logarithmic conversion mode among the pixel data output from the A/D converter 4 into pixel data which would be obtained if the linear conversion mode were selected instead of the logarithmic conversion mode. In other words, the photoelectric conversion property changer 51 performs photoelectric conversion property changing operation for converting pixel values obtained by logarithmic conversion into pixel values expected to be obtained by linear conversion.

Figure 7:
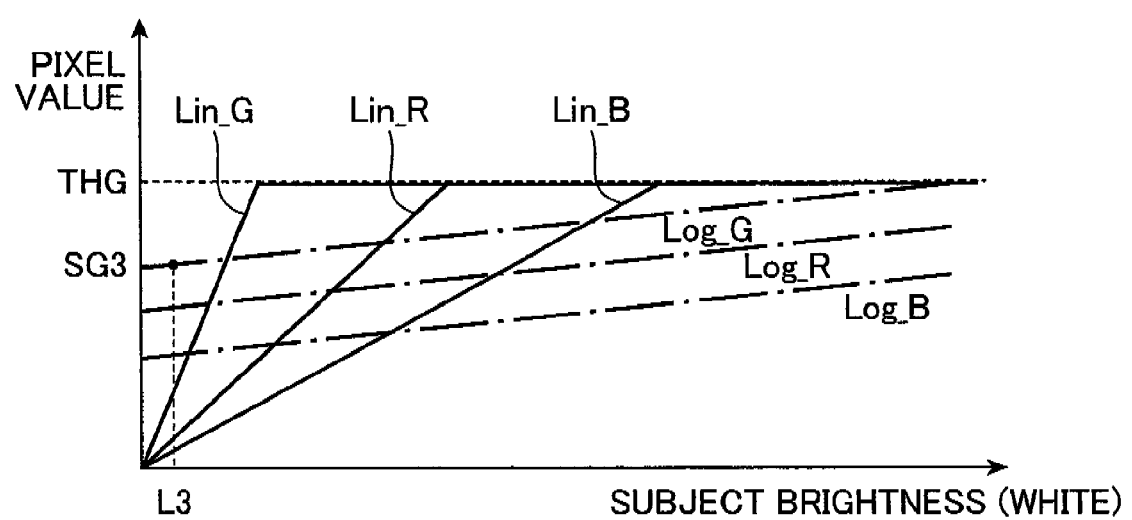
FIG. 7 is a graph showing a relationship between subject brightness and pixel values obtained when an optical image of a white subject is picked up by pixels provided with green (G), red (R) and blue (B) color filters of the image sensor in the linear and logarithmic conversion modes.

FIG. 7 is a graph showing a relationship between subject brightness and pixel values obtained when an optical image of a white subject is picked up by the G, R and B pixels of the image sensor 3 in the linear and logarithmic conversion modes. As shown by solid lines in FIG. 7, the pixel values obtained in the linear conversion mode increase with an increase in the subject brightness until the pixel values saturate at a specific pixel value THG. Also, as shown by alternate long and short dashed lines in FIG. 7, the pixel values obtained in the logarithmic conversion mode increase with an increase in the subject brightness too, but increasing rates of the pixel values are smaller than those of the pixel values obtained in the linear conversion mode. As previously mentioned, the G, R and B pixels have progressively lower sensitivities in this order in this embodiment so that the increasing rates of the pixel values obtained from the G, R and B pixels decrease in the same order. In FIG. 7, pixel value tracings obtained in the linear conversion mode are designated by "Lin" and those obtained in the logarithmic conversion mode are designated by "Log".

Figure 8:
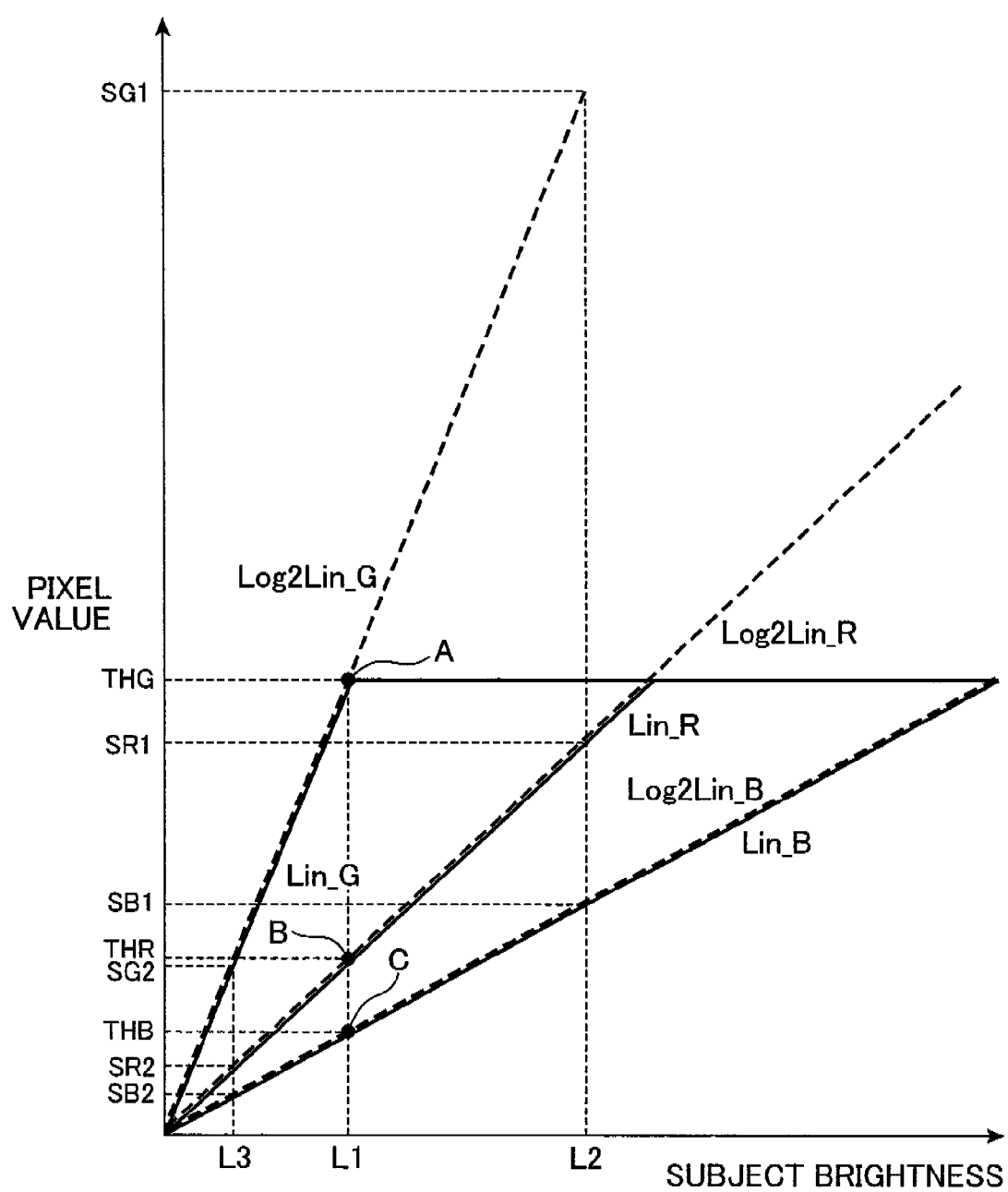
FIG. 8 is a graph showing pixel value tracings (solid lines) obtained in the linear conversion mode and pixel value tracings (broken lines) obtained by converting the pixel values obtained in the logarithmic conversion mode into pixel values expected to be obtained in the linear conversion mode, in which horizontal and vertical axes represent the subject brightness and the pixel value, respectively.

If the photoelectric conversion property changer 51 performs the aforementioned photoelectric conversion property changing operation for converting the pixel values obtained by logarithmic conversion shown by the alternate long and short dashed lines in FIG. 7 into pixel values which would be obtained by linear conversion, then the result would be as shown in FIG. 8. FIG. 8 is a graph showing pixel value tracings (solid lines) obtained from a white subject in the linear conversion mode and pixel value tracings (broken lines) obtained by converting the pixel values obtained in the logarithmic conversion mode into pixel values expected to be obtained from the white subject in the linear conversion mode, in which horizontal and vertical axes represent the subject brightness and the pixel value, respectively. As shown in FIG. 8, when the photoelectric conversion property changing operation is executed to convert the pixel values obtained by logarithmic conversion into the pixel values expected to be obtained by linear conversion, the pixel value tracings obtained are lines produced by extending straight line segments of the pixel value tracings obtained in the true linear conversion mode by specific amounts. In FIG. 8, the pixel value tracings obtained in the linear conversion mode are designated by "Lin" and those obtained by converting the pixel values obtained in the logarithmic conversion mode into pixel values expected to be obtained in the linear conversion mode are designated by "Log2Lin". It is to be noted that the pixel value tracings obtained in the linear and logarithmic conversion modes are offset by a slight amount for ease of visualization in FIG. 8. It will be appreciated from the pixel value tracings of FIG. 8 that the image sensor 3 offers a wider dynamic range in the logarithmic conversion mode than in the true linear conversion mode.

For example, the photoelectric conversion property changer 51 has a look-up table defining a known relationship between pixel values of image data obtained in the logarithmic conversion mode and pixel values of image data which would be obtained if the linear conversion mode were selected instead of the logarithmic conversion mode at the same subject brightness. The photoelectric conversion property changer 51 can convert the pixel values obtained in the logarithmic conversion mode into the pixel values which would be obtained if the image sensor 3 were operated in the linear conversion mode using such a look-up table. A relationship between the pixel values on the pixel value tracings shown by the alternate long and short dashed lines in FIG. 7 and the pixel values on the pixel value tracings shown by the broken lines in FIG. 8 is an example of the aforementioned known relationship between the pixel values obtained in the logarithmic conversion mode and the pixel values which would be obtained if the linear conversion mode were selected instead of the logarithmic conversion mode.

Provided that the pixel value of image data obtained in the logarithmic conversion mode is SG3 at subject brightness L3 and the pixel value of image data which would be obtained if the linear conversion mode were selected instead of the logarithmic conversion mode is SG2 at the same subject brightness L3 as shown in FIGS. 7 and 8, for example, the pixel values SG3 and SG2 are preregistered in relation to each other in the photoelectric conversion property changer 51. Accordingly, if the pixel value of image data obtained by logarithmic conversion is SG3, the photoelectric conversion property changer 51 converts this pixel value SG3 into the pixel value SG2.

The first white balance evaluation value calculator 52 calculates first white balance evaluation values which are, for example, average values over the entire sensor surface of the three primary color (RGB) components of the pixel data obtained by linear conversion among all the pixel data taken from the image sensor 3 through the A/D converter 4. These first white balance evaluation values are a first white balance evaluation value AveRL for red (R), a first white balance evaluation value AveGL for green (G) and a first white balance evaluation value AveBL for blue (B).

The second white balance evaluation value calculator 53 calculates second white balance evaluation values which are, for example, average values over the entire sensor surface of the three primary color (RGB) components of the pixel data obtained by logarithmic conversion among all the pixel data taken from the image sensor 3 through the A/D converter 4. These second white balance evaluation values are a second white balance evaluation value AveRH for red (R), a second white balance evaluation value AveGH for green (G) and a second white balance evaluation value AveBH for blue (B).

While the first and second white balance evaluation value calculators 52, 53 use the pixel data obtained from the entire sensor surface for calculating the first and second white balance evaluation values as discussed above, the embodiment is not limited to this arrangement but the first and second white balance evaluation value calculators 52, 53 may calculate the white balance evaluation values from part of the pixel data obtained from the sensor surface. Also, while the first and second white balance evaluation value calculators 52, 53 employ arithmetic means of the pixel data obtained from the entire sensor surface or part thereof as the first and second white balance evaluation values as discussed above, the embodiment is not limited to this arrangement. For example, the first and second white balance evaluation value calculators 52, 53 may assign weights to individual elements of the pixel data obtained by linear conversion and logarithmic conversion according to locations in a captured image and employ weighted means of the pixel data obtained by linear conversion and logarithmic conversion as the first and second white balance evaluation values.

The white balance correction coefficient calculator 54 calculates coefficients (hereinafter referred to as correction coefficients) used for white balance correction of the pixel data obtained from the image sensor 3 through the A/D converter 4. First, the white balance correction coefficient calculator 54 performs weighted averaging operation by using first and second weighting factors which are preset in relation to the first and second white balance evaluation values calculated by the first and second white balance evaluation value calculators 52, 53, respectively.

Assuming that the first weighting factor preset in the first white balance evaluation value calculator 52 is kL and the second weighting factor preset in the second white balance evaluation value calculator 53 is kH, the white balance correction coefficient calculator 54 calculates an R-component evaluation value AveR, a G-component evaluation value AveG and a B-component evaluation value AveB by equations (1), (2) and (3) below:

$$AveR = \{(AveRL \times kL) + (AveRH \times kH)\}/(kL+kH) \quad (1)$$

$$AveG = \{(AveGL \times kL) + (AveGH \times kH)\}/(kL+kH) \quad (2)$$

$$AveB = \{(AveBL \times kL) + (AveBH \times kH)\}/(kL+kH) \quad (3)$$

Then, using the R-component evaluation value AveR, the G-component evaluation value AveG and the B-component evaluation value AveB calculated by equations (1), (2) and (3) above, the white balance correction coefficient calculator 54 calculates a ratio AveG/AveR of the G-component evaluation value AveG to the R-component evaluation value AveR and a ratio AveG/AveB of the G-component evaluation value AveG to the B-component evaluation value AveB and employ these ratios AveG/AveR, AveG/AveB as an R-component correction coefficient Rgain and a B-component correction coefficient Bgain, respectively.

The present embodiment employs an arrangement for carrying out a procedure for selecting pixel data used for constituting a captured image from the pixel data obtained by linear conversion or the pixel data obtained by logarithmic conversion and passed through the aforementioned photoelectric conversion property changing operation. This pixel data selecting procedure is to select the pixel data based on a comparison between pixel values of the pixel data obtained by linear conversion and a reference value (later-described threshold value).

In this embodiment, the threshold value is preset for the G pixels having the highest sensitivity. Threshold values THR, THB for the R pixels and the B pixels are calculated from the threshold value THG preset for the G pixels and the aforementioned correction coefficients Rgain, Bgain, respectively. In this embodiment, the threshold value THG for the G pixels (for green) is set at a saturation level. It is to be noted that the threshold value THG for the G pixels need not necessarily be set at the saturation level but may be set as appropriate within a range not exceeding the saturation level.

The threshold calculator 55 calculates the threshold values THR, THB for the other color pixels (R and B pixels) from equations (4) and (5) below by using the threshold value THG preset for the G pixels:

$$THR = THG/Rgain \quad (4)$$

$$THB = THG/Bgain \quad (b\ 5)$$

In the graph of FIG. 8, a point marked by the letter "A" is where the G pixels the saturated state and this point is referred to as an inflection point A. The aforementioned threshold values THR, THB define points B, C (FIG. 8) at which the same subject brightness as at the inflection point A is attained on the pixel value tracings obtained by linear conversion with the R and B pixels, respectively, when a white subject is shot.

The comparative selector 56 compares the pixel values of the pixel data obtained by linear conversion with the G, R and B pixels with the threshold values THG, THR and THB for green, red and blue, respectively. The comparative selector 56 then selects the pixel data obtained by linear conversion or the pixel data obtained by logarithmic conversion as pixel data to be subjected to the white balance correction performed by the white balance corrector 57 provided in a succeeding stage, and finally as pixel data to be used for constituting a captured image, according to the result of the aforementioned comparison. To be more specific, the comparative selector 56 selects the pixel data obtained by linear conversion if the pixel value of the pixel data obtained from a particular pixel by linear conversion is smaller than the corresponding threshold value, whereas the comparative selector 56 selects the pixel data obtained by logarithmic conversion if the pixel value of the pixel data obtained from a particular pixel by logarithmic conversion is equal to or larger than the corresponding threshold value.

Referring to the graph of FIG. 8, for example, if the subject brightness is L3 which is lower than L1, the pixel value of pixel data obtained from a particular G pixel by linear conversion is SG2 which is smaller than the aforementioned threshold value THG preset for the relevant pixel color. Accordingly, the comparative selector 56 selects the pixel data (pixel value SG2) obtained by linear conversion from that particular pixel. The pixel value of pixel data obtained from a particular R pixel by linear conversion is SR2 at the same subject brightness L3 as shown in FIG. 8. This pixel value SR2 is smaller than the aforementioned threshold value THR for the relevant pixel color so that the comparative selector 56 selects the pixel data (pixel value SR2) obtained by linear conversion from that particular pixel. Further, the pixel value of pixel data obtained from a particular B pixel by linear conversion is SB2 at the same subject brightness L3 as shown in FIG. 8. This pixel value SB2 is smaller than the aforementioned threshold value THB for the relevant pixel color so that the comparative selector 56 also selects the pixel data (pixel value SB2) obtained by linear conversion from that particular pixel.

On the other hand, if the subject brightness is L2 which exceeds L1, the pixel value of pixel data obtained from a particular G pixel by linear conversion is equal to the aforementioned threshold value THG preset for the relevant pixel color. Accordingly, the comparative selector 56 selects the pixel data (pixel value SG1) obtained by logarithmic conversion from that particular pixel. The pixel value of pixel data obtained from a particular R pixel by linear conversion is SR1 at the same subject brightness L2 as shown in FIG. 8. This pixel value SR1 is larger than the aforementioned threshold value THR for the relevant pixel color so that the comparative selector 56 selects the pixel data (pixel value SR1) obtained by logarithmic conversion from that particular pixel. Further, the pixel value of pixel data obtained from a particular B pixel by logarithmic conversion is SB1 at the same subject brightness L2 as shown in FIG. 8. This pixel value SB1 is larger than the aforementioned threshold value THB for the relevant pixel color so that the comparative selector 56 also selects the pixel data (pixel value SB1) obtained by logarithmic conversion from that particular pixel.

In a case where the brightness of the subject varies from a relatively high level (this subject is hereinafter referred to as the high-brightness subject) to a relatively low level (this subject is hereinafter referred to as the low-brightness subject) during a single exposure period, however, linear conversion is performed primarily on the high-brightness subject and logarithmic conversion is performed primarily on the low-brightness subject.

If the aforementioned pixel data selecting procedure is such that the comparative selector 56 selects the pixel data obtained by logarithmic conversion from any type of subject for reasons that the pixel value of the pixel data obtained from a particular pixel by linear conversion is not smaller than the threshold value preset for the relevant pixel color, the image sensor 3 will be unable to capture an image containing the high-brightness subject although it is necessary to produce such an image. This is because the pixel data obtained by logarithmic conversion does not reflect the high-brightness subject with high fidelity.

For example, if the subject transfers from a high-brightness subject having brightness L2 to a low-brightness subject having brightness L3 during a particular exposure period, the pixel data obtained from the pixels of the individual colors (RGB) by linear conversion have pixel values equal to or larger than the corresponding threshold values. Thus, if the pixel data obtained by logarithmic conversion are selected in this case, the pixel values of the pixel data become SG2, SR2 and SB2 which primarily reflect the brightness L3 of the low-brightness subject, and not the brightness L2 of the high-brightness subject. It is therefore impossible to obtain an image reflecting the high-brightness subject with high fidelity in this case To avoid this inconvenience, the present embodiment employs such an arrangement that the comparative selector 56 exceptionally selects the pixel data having pixel values corresponding to the pixel values of the respective color (RGB) pixels preset as the threshold values as the pixel data to be subjected to the white balance correction performed by the white balance corrector 57 if the subject brightness varies during a single exposure period as discussed above even when the pixel values of the pixel data obtained from the individual pixels by linear conversion are not smaller than the respective threshold values.

Specifically, if the subject brightness varies from L2 to L3 during a particular exposure period, for instance, the comparative selector 56 selects the pixel data having the pixel value THG obtained from the G pixels, the pixel data having the pixel value THR obtained from the R pixels and the pixel data having the pixel value THB obtained from the B pixels as the pixel data to be subjected to the white balance correction performed by the white balance corrector 57.

The aforementioned threshold values THR and THB correspond respectively to the pixel values of the pixel data for green (G) and blue (B) at the subject brightness L1 which differs from the subject brightness L2. Therefore, if the pixel data having pixel values corresponding to the threshold values THG, THR and THB are selected as the pixel data to be subjected to the white balance correction performed by the white balance corrector 57, the brightness of an image obtained will deviate from the actual subject brightness. Nevertheless, since the pixel values of the pixel data are obtained from the pixels of the individual colors (RGB), white balance of the image can be set to reproduce faithfully the actual subject when the white balance correction is made by the white balance corrector 57 provided in the succeeding stage.

It is possible to judge whether a change in the subject brightness has occurred based on whether the pixel values of pixel data obtained from the pixels of a particular color by logarithmic conversion are smaller than the threshold value preset for the pertinent color. Accordingly, the comparative selector 56 judges that a change in the subject brightness, like the one as mentioned above, has occurred when the pixel values of pixel data obtained from the pixels of a particular color by logarithmic conversion are smaller than the threshold value preset for the pertinent color.

The white balance corrector 57 performs the white balance correction on the pixel data selected by the comparative selector 56 by using the correction coefficients Rgain, Bgain calculated by the white balance correction coefficient calculator 54. To be more specific, the white balance corrector 57 multiplies the pixel values of the pixel data obtained from the R pixels by linear conversion or logarithmic conversion and output from the comparative selector 56 by the aforementioned R-component correction coefficient Rgain and outputs data on a product thus obtained as image data with corrected white balance to the control block 7. Additionally, the white balance corrector 57 multiplies the pixel values of the pixel data obtained from the B pixels by linear conversion or logarithmic conversion and output from the comparative selector 56 by the aforementioned B-component correction coefficient Bgain and outputs data on a product thus obtained as image data with corrected white balance to the control block 7.

Figure 9:
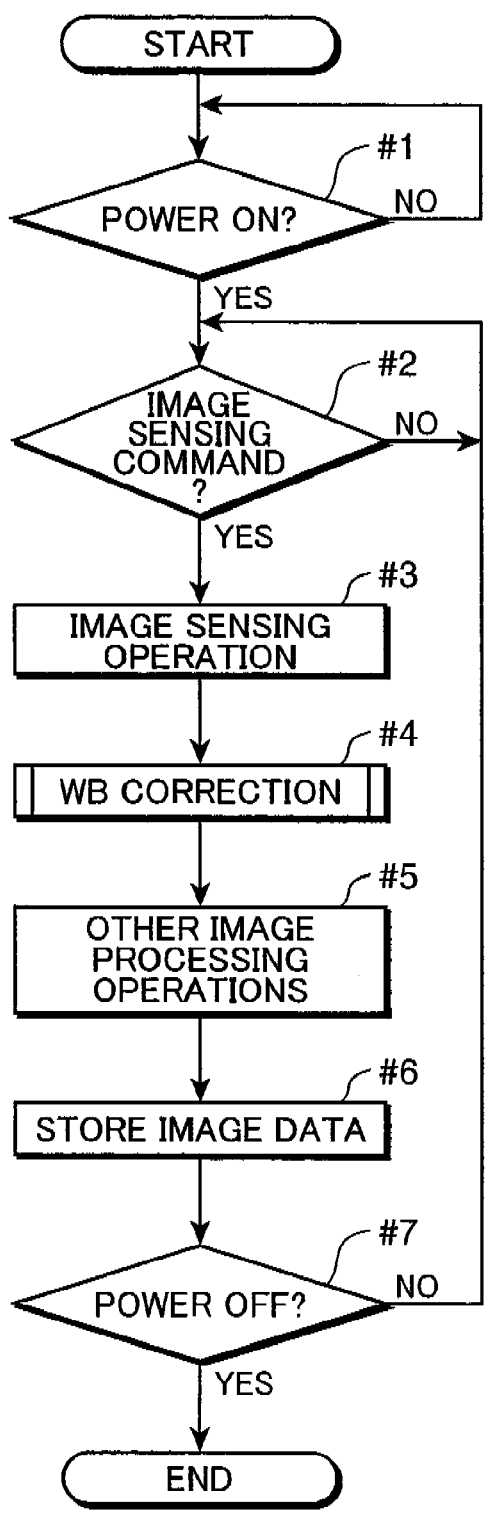
FIG. 9 is a flowchart showing a procedure of image sensing operation performed by the image sensing apparatus.

FIG. 9 is a flowchart showing a procedure of image sensing operation performed by the image sensing apparatus 1. When the unillustrated power on/off button of the image sensing apparatus 1 is turned on (Yes in step #1) and an image sensing command is entered by operating the unillustrated shutter button (Yes in step #2), the image sensor 3 performs an image sensing operation (step #3). The image sensing operation involves an image sensing process by linear conversion followed by an image sensing process by logarithmic conversion. Then, the white balance corrector 57 performs the white balance correction on the pixel data obtained by linear conversion or logarithmic conversion and output from the individual pixels of the image sensor 3 (step #4). Subsequently, the pixel data of which white balance has been corrected are passed through other image processing operations, such as gamma correction (step #5). Image data obtained by such image processing operations are then output to the control block 7 and/or recorded in an unillustrated data storage device (step #6). The aforementioned operations of steps #2 through #7 are repetitively executed until the image sensing apparatus 1 is turned off by operating the power on/off button (Yes in step #7) whereby the procedure of FIG. 9 is finished.

Figure 10:
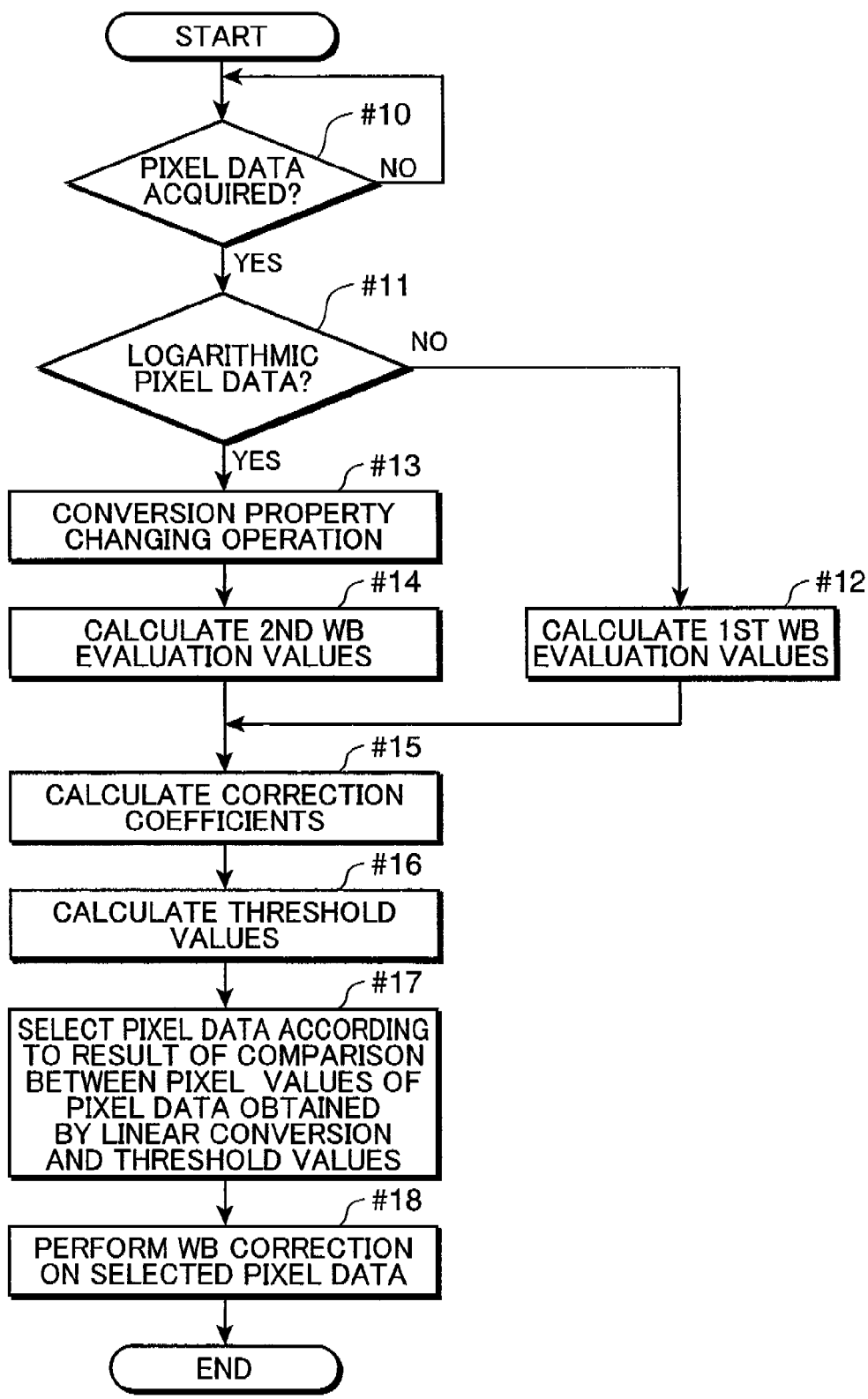
FIG. 10 is a flowchart showing a procedure of image processing operation performed by the image processing block according to the first embodiment.

FIG. 10 is a flowchart showing a procedure of the image processing operation performed by the image processing block 5. If the pixel data acquired from the A/D converter 4 are pixel data obtained by linear conversion (Yes in step #10 and No in step #11), the image processing block 5 calculates the first white balance evaluation values which are, for example, average values of these pixel data over the entire sensor surface (step #12). On the other hand, if the pixel data acquired from the A/D converter 4 are pixel data obtained by logarithmic conversion (Yes in step #10 and Yes in step #11), the image processing block 5 performs the aforementioned photoelectric conversion property changing operation for converting the pixel values obtained by logarithmic conversion into pixel values expected to be obtained by linear conversion (step #13) In this case, the image processing block 5 calculates the second white balance evaluation values which are, for example, average values of the pixel values over the entire sensor surface obtained through the photoelectric conversion property changing operation (step #14).

Then, the image processing block 5 calculates the correction coefficients Rgain, Bgain from the first and second white balance evaluation values obtained in steps #12 and #14 by using the earlier-mentioned equations (1), (2) and (3) (step #15). Next, the image processing block 5 calculates the threshold values THR, THB for the red R and B pixels from the correction coefficients Rgain, Bgain and the threshold value THG for the G pixels by using the earlier-mentioned equations (4) and (5) (step #16).

Subsequently, the image processing block 5 selects the pixel data obtained by linear conversion or the pixel data obtained by logarithmic conversion according to the result of comparison between the pixel values of the pixel data obtained from the color pixels by linear conversion and the threshold values set for the respective color pixels (step #17). Further, if the subject transfers from a high-brightness subject to a low-brightness subject, the image processing block 5 exceptionally selects the threshold values preset for the respective color (RGB) pixels as the pixel data to be subjected to the white balance correction. Then, the image processing block 5 performs the white balance correction on the selected pixel data by using the aforementioned correction coefficients (step #18).

In this embodiment, the image processing block 5 calculates the correction coefficients Rgain, Bgain and the threshold values THR, THB for the red R and B pixels by using the pixel data obtained by linear conversion and logarithmic conversion and selects the pixel data obtained by linear conversion or the pixel data obtained by logarithmic conversion according to the result of comparison between the pixel values of the pixel data obtained from the color pixels by linear conversion and the threshold values set for the respective color pixels. It is therefore possible to perform the white balance correction in such a way that an image reproducing faithfully the actual subject can be obtained.

Particularly in the present embodiment, if the subject transfers from a high-brightness subject to a low-brightness subject during exposure, the image processing block 5 selects the pixel data having pixel values corresponding to the threshold values for the respective color (RGB) pixels as the pixel data to be subjected to the white balance correction. This arrangement makes it possible to perform the white balance correction in such a way that an image reproducing faithfully the actual subject can be obtained even when a change in the subject brightness occurs as discussed above. As a result, it is possible to prevent the color fringing of the prior art.

Second Embodiment

Figure 11:
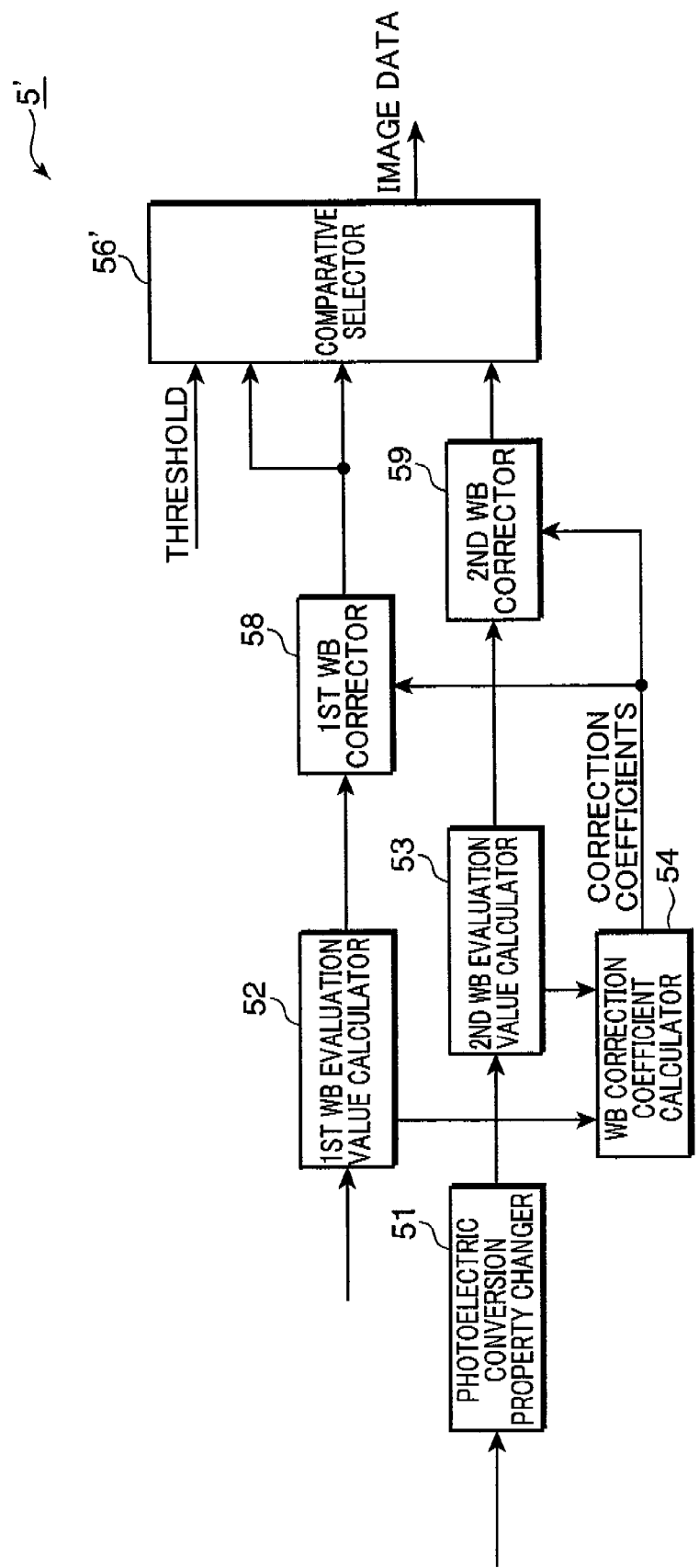
FIG. 11 is a block diagram showing the electrical configuration of an image processing block according to a second embodiment of the invention.

A second embodiment of the invention employs an image processing block 5' which performs white balance correction in a manner different from the image processing block 5 of the first embodiment, the image processing block 5' having an electrical configuration different from that of the image processing block 5. Generally, the image processing block 5' of the second embodiment is otherwise the same as the image processing block 5 of the first embodiment, so that the following discussion deals only with differences between the first and second embodiments. FIG. 11 is a block diagram showing the electrical configuration of the image processing block 5' of the second embodiment, in which elements identical or similar to those of the first embodiment are designated by the same reference numerals.

As shown in FIG. 11, the image processing block 5' includes a photoelectric conversion property changer 51, a first white balance evaluation value calculator 52, a second white balance evaluation value calculator 53, a white balance correction coefficient calculator 54, a first white balance corrector 58, a second white balance corrector 59 and a comparative selector 56'. Since the photoelectric conversion property changer 51, the first white balance evaluation value calculator 52, the second white balance evaluation value calculator 53 and the white balance correction coefficient calculator 54 are generally the same as those of the first embodiment, the following discussion does not include a description of these elements What is characteristic of the second embodiment is that pixel data obtained by linear conversion or pixel data obtained by logarithmic conversion are individually subjected to the white balance correction before the pixel data obtained by linear conversion or the pixel data obtained by logarithmic conversion are selected as pixel data used for constituting a captured image.

Figure 12:
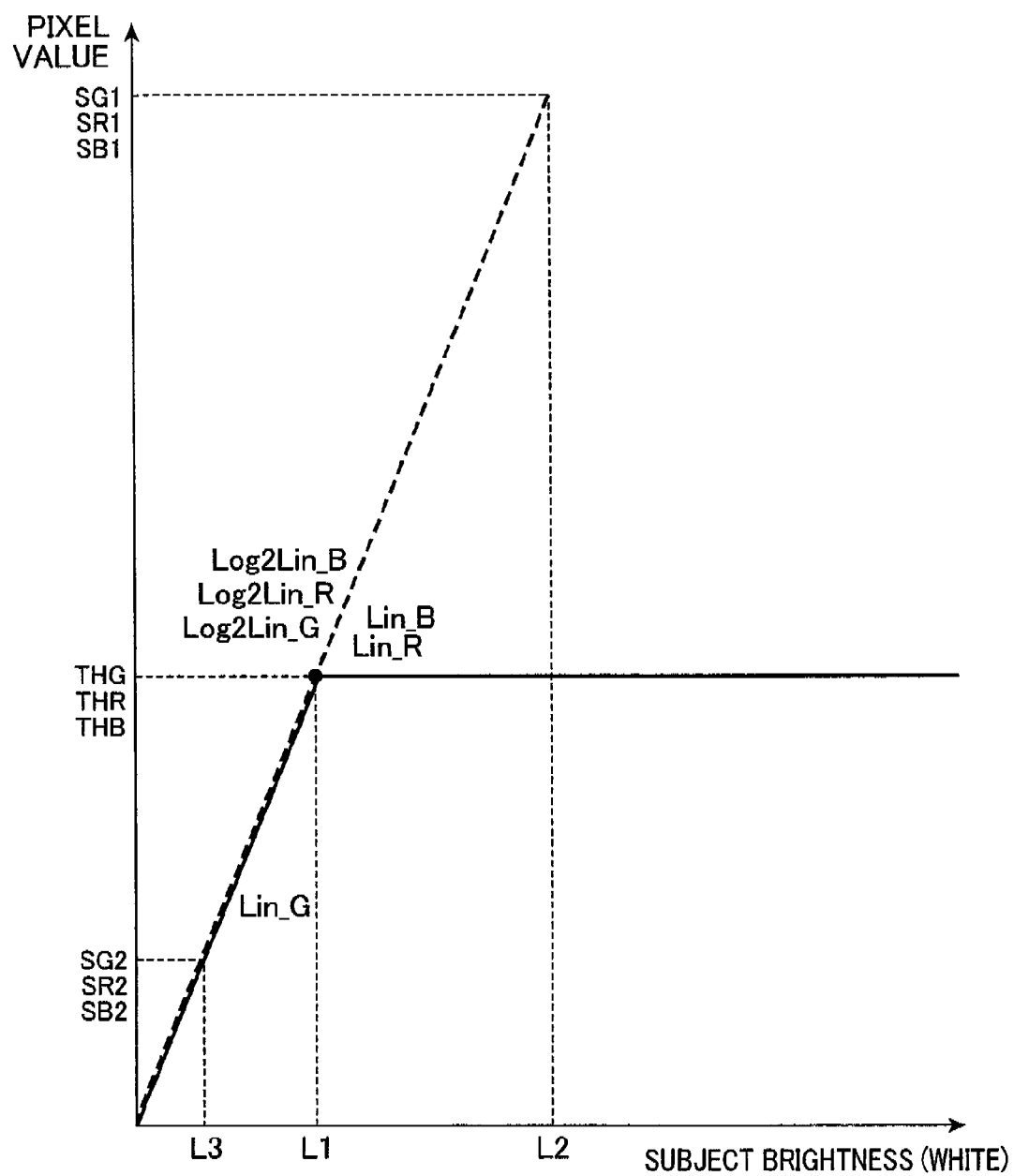
FIG. 12 is a graph showing pixel value tracings obtained in the linear conversion mode (solid lines) and pixel value tracings obtained by converting pixel values obtained in the logarithmic conversion mode into pixel values expected to be obtained in the linear conversion mode (broken lines) according to the second embodiment, in which horizontal and vertical axes represent the subject brightness and the pixel value, respectively.

The first white balance corrector 58 performs the white balance correction on the pixel data obtained by linear conversion. Specifically, the first white balance corrector 58 multiplies the pixel values of the pixel data obtained by linear conversion by the correction coefficients Rgain, Bgain calculated by the white balance correction coefficient calculator 54. This white balance correction performed by the first white balance corrector 58 corresponds to a process of converting the pixel value tracings representing the pixel data obtained from the R and B pixels by linear conversion shown in FIG. 8 into a pixel value tracing representing the pixel data obtained from the G pixels by linear conversion shown in FIG. 12.

The second white balance corrector 59 performs the white balance correction on the pixel data obtained by logarithmic conversion. Specifically, the second white balance corrector 59 multiplies the pixel values of the pixel data obtained from the R and B pixels by logarithmic conversion and passed through the aforementioned photoelectric conversion property changing operation by the correction coefficients Rgain, Bgain calculated by the white balance correction coefficient calculator 54. This white balance correction performed by the second white balance corrector 59 corresponds to a process of converting the pixel value tracings representing the pixel data obtained from the R and B pixels by logarithmic conversion and passed through the photoelectric conversion property changing operation shown in FIG. 8 into a pixel value tracing representing the pixel data obtained from the G pixels by logarithmic conversion and passed through the photoelectric conversion property changing operation shown in FIG. 12.

In the second embodiment, the white balance correction is performed by the first and second white balance correctors 58, 59 so that the threshold values THG, THR and THB for green, red and blue coincide with one another.

The comparative selector 56' compares the pixel values of the pixel data obtained by linear conversion with the G, R and B pixels with the threshold value THG and, then, selects the pixel data obtained by linear conversion or the pixel data obtained by logarithmic conversion as the pixel data used for constituting the captured image for the individual pixels according to the result of comparison.

To be more specific, if the pixel value of the pixel data obtained from a particular pixel by linear conversion is smaller than the threshold value THG, the comparative selector 56' selects the pixel data obtained by linear conversion. Referring to a graph of FIG. 12, if the subject brightness is L3 which is lower than L1, for example, the pixel values of the pixel data obtained by linear conversion for the individual colors (RGB) are SG2, SR2 and SB2 which are smaller than the threshold value THG (=THR=THB). Accordingly, the comparative selector 56' selects the pixel data having the pixel value SG2 obtained by linear conversion as the pixel data used for constituting the captured image with respect to the G pixels. Similarly, the comparative selector 56' selects the pixel data having the pixel value SR2 obtained by linear conversion as the pixel data used for constituting the captured image with respect to the R pixels and the pixel data having the pixel value SB2 obtained by linear conversion as the pixel data used for constituting the captured image with respect to the B pixels.

On the other hand, if the pixel value of the pixel data obtained from a particular pixel by linear conversion is equal to or larger than the threshold value THG, the comparative selector 56' selects the pixel data obtained by logarithmic conversion. Referring to the graph of FIG. 12, if the subject brightness is L2 which is higher than L1, for example, the pixel values of the pixel data obtained by linear conversion for the individual colors (RGB) are SG1, SR1 and SB1 which are larger than the threshold value THG. Accordingly, the comparative selector 56' selects the pixel data having the pixel value SG1 obtained by logarithmic conversion as the pixel data used for constituting the captured image with respect to the G pixels. Similarly, the comparative selector 56' selects the pixel data having the pixel value SR1 obtained by logarithmic conversion as the pixel data used for constituting the captured image with respect to the R pixels and the pixel data having the pixel value SB1 obtained by logarithmic conversion as the pixel data used for constituting the captured image with respect to the B pixels.

Further, if the subject transfers from a high-brightness subject (e.g., the subject having brightness L2) to a low-brightness subject (e.g., the subject having brightness L3) during exposure, the comparative selector 56' exceptionally selects the pixel data having pixel values corresponding to the threshold value THG, and not the pixel data obtained by logarithmic conversion, as the pixel data used for constituting the captured image even when the pixel values of the pixel data obtained from particular pixels by linear conversion are not smaller than the threshold value THG as in the first embodiment.

Specifically, if the subject brightness varies from L2 to L3 during a particular exposure period, for instance, the comparative selector 56' selects the pixel data having the pixel value THG (=THR=THB) obtained from the pixels of the individual colors (RGB).

Figure 13:
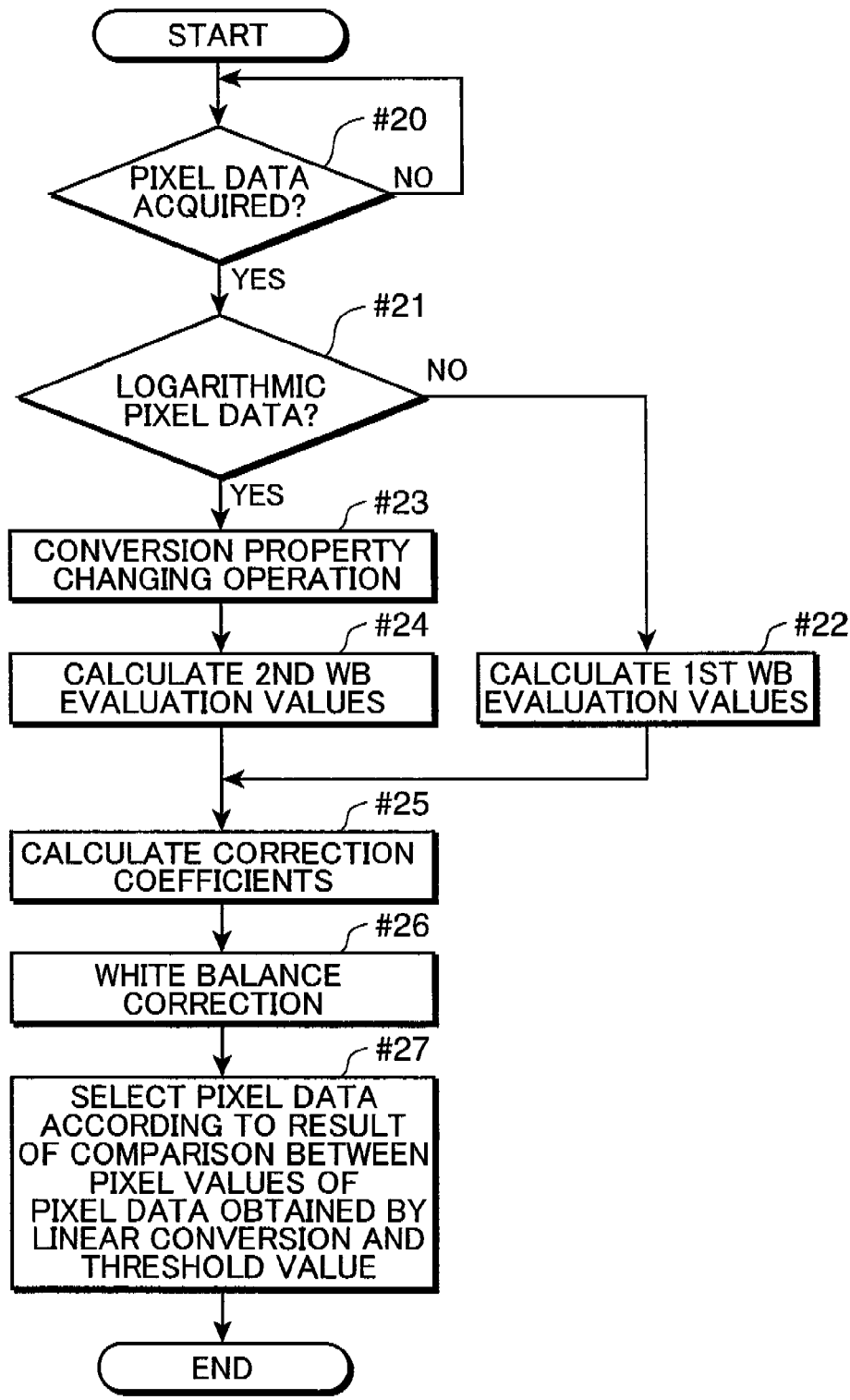
FIG. 13 is a flowchart showing a procedure of image processing operation performed by the image processing block according to the second embodiment.

FIG. 13 is a flowchart showing a procedure of the image processing operation performed by the image processing block 5'. Upon acquiring the pixel data from the A/D converter 4 (step #20), the image processing block 5' performs the same operations as discussed with reference to steps #11 to #15 of FIG. 10 (steps #21 to #25).

Subsequently, the image processing block 5' performs the white balance correction on the pixel data obtained from the individual pixels by linear conversion and logarithmic conversion (step #26) and, then, selects the pixel data obtained by linear conversion or the pixel data obtained by logarithmic conversion as the pixel data used for constituting the captured image according to the result of comparison between the pixel values of the pixel data obtained from the pixels of the individual colors (RGB) by linear conversion and the threshold value THG (step #27).

It is possible to perform the white balance correction in such a way that an image reproducing faithfully the actual subject can be obtained also in the above-described second embodiment. In particular, even if the subject transfers from a high-brightness subject to a low-brightness subject during exposure, it is possible to obtain an image reproducing faithfully the subject.

The above-described arrangements of the embodiments may be modified in various ways, some of which examples are described in the following.

While the white balance correction coefficient calculator 54 of the image processing block 5 of the first embodiment calculates the correction coefficients used for white balance correction by using the pixel data obtained with the G pixels as a reference as can be noticed by the earlier-mentioned equations (4) and (5), this arrangement of the first embodiment may be so modified as to calculate the correction coefficients by using the pixel data obtained with the other pixels than the G pixels. It is to be noted, however, that processing performed by the comparative selector 56 is made easier if the correction coefficients are calculated by using the pixel data obtained with the G pixels as a reference.

While the correction coefficients are calculated by using earlier-mentioned equations (4) and (5) in the foregoing first and second embodiments, this approach may be so modified as to estimate a light source used for illuminating the subject based on the first and second white balance evaluation values for the respective colors and employ correction coefficients predefined for the estimated light source instead of the correction coefficients calculated as previously discussed with reference to the first embodiment.

While the foregoing discussion of the preferred embodiments has illustrated the image sensing operation performed by linear conversion or logarithmic conversion, the invention is not limited to this combination of photoelectric conversion processes. As an alternative, the image sensing operation may be accomplished by using a combination of first and second linear conversion processes performed with different exposure times.

Figure 14:
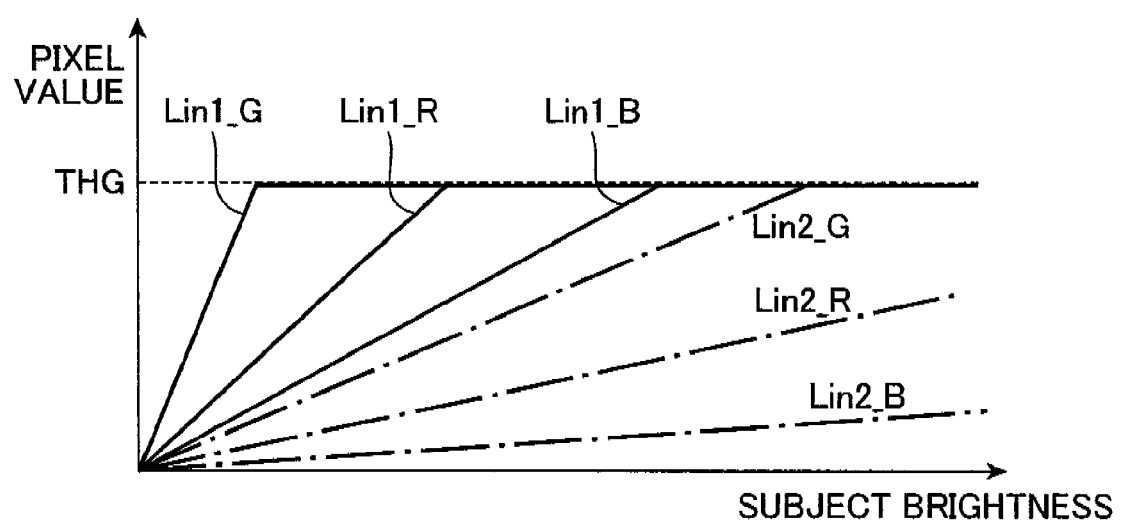
FIG. 14 is a graph showing a relationship between subject brightness and pixel values obtained when an optical image of a white subject is picked up by pixels provided with the green (G), red (R) and blue (B) color filters of the image sensor through first and second linear conversion processes performed with different exposure times.

FIG. 14 is a graph showing a relationship between subject brightness and pixel values obtained when an optical image of a white subject is picked up by the G, R and B pixels through the aforementioned first and second linear conversion processes performed with the different exposure times. As shown by solid lines in FIG. 14, the pixel values obtained through the first linear conversion process increase with an increase in the subject brightness until the pixel values saturate at a specific pixel value SG1 (which corresponds to the aforementioned threshold value THG) Also, as shown by alternate long and short dashed lines in FIG. 14, the pixel values obtained through the second linear conversion process increase with an increase in the subject brightness too, but increasing rates of the pixel values are smaller than those of the pixel values obtained through the first linear conversion process as can be seen from a comparison between the pixel values obtained from the pixels of the same colors through the two conversion processes. The G, R and B pixels have progressively lower sensitivities in this order in this modification of the embodiment as well so that the increasing rates of the pixel values obtained from the G, R and B pixels decrease in the same order.

Figure 15:
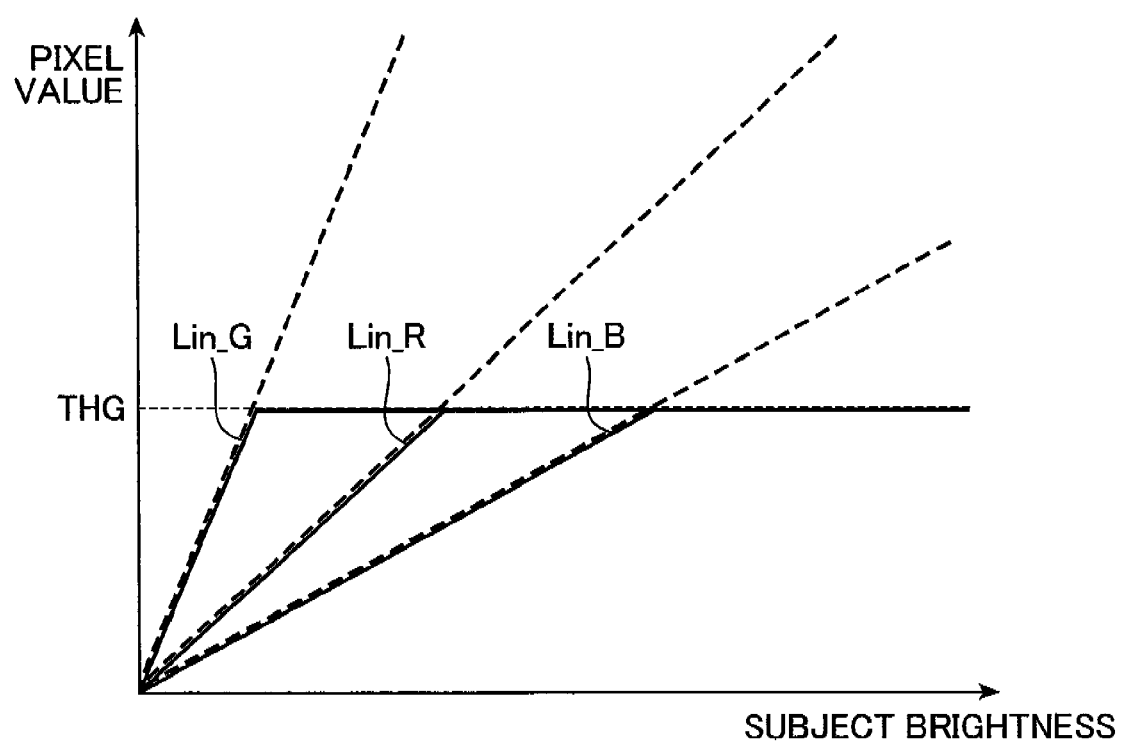
FIG. 15 is a graph showing pixel value tracings (solid lines) of the same pixel values obtained through the first linear conversion process as shown by solid lines in FIG. 14 and pixel value tracings (broken lines) obtained by converting the pixel values obtained through the second linear conversion process shown by alternate long and short dashed lines in FIG. 14 into pixel values expected to be obtained through the first linear conversion process, in which horizontal and vertical axes represent the subject brightness and the pixel value, respectively.
Figure 16:
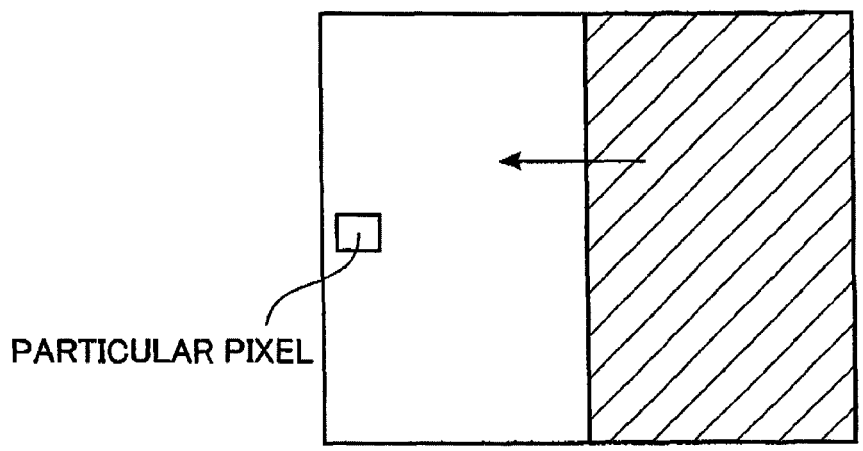
FIG. 16 is a diagram showing a situation in which a subject sensed by a particular pixel varies from a high-brightness subject to a low-brightness subject having approximately zero brightness during an exposure period.
Figure 17:
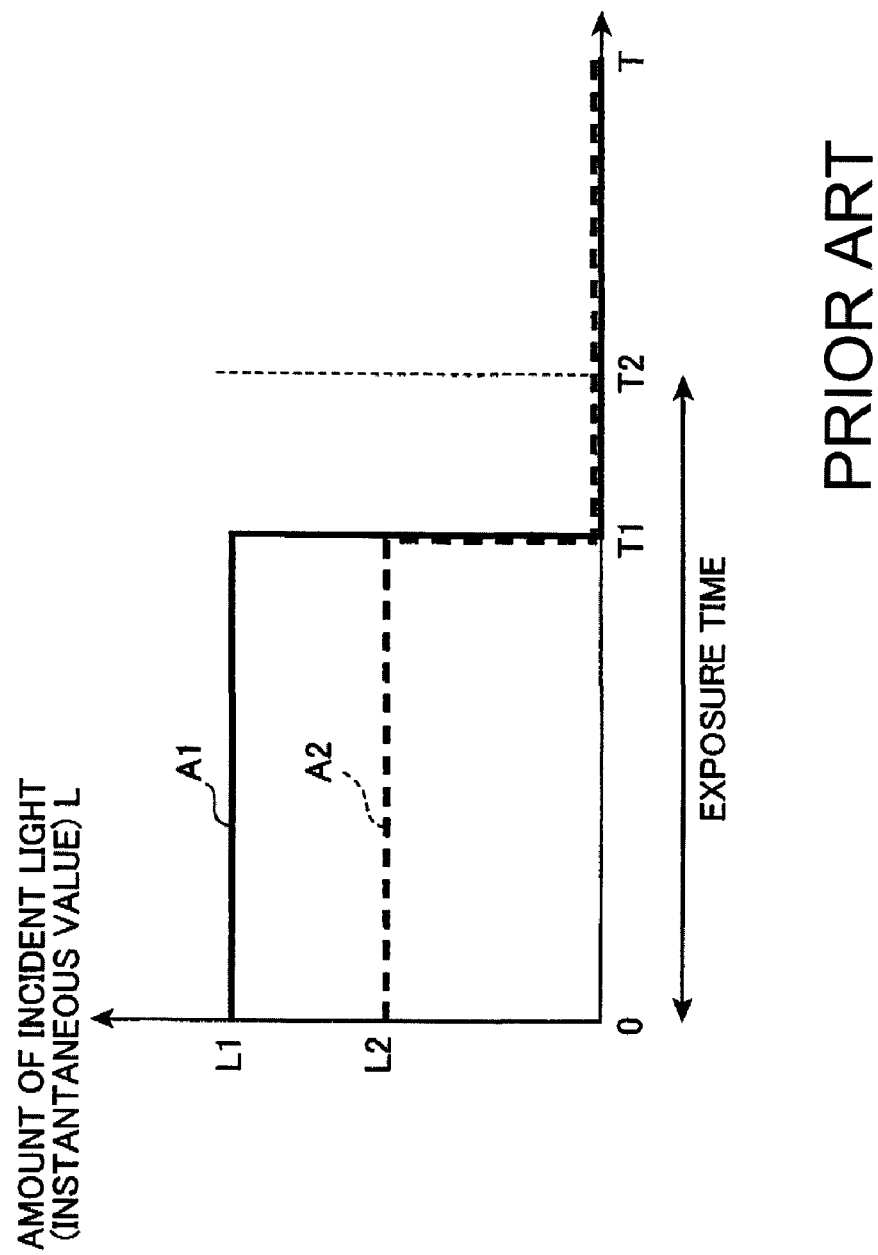
FIG. 17 is a graph for explaining a problem of a prior art arrangement.
Figure 18:
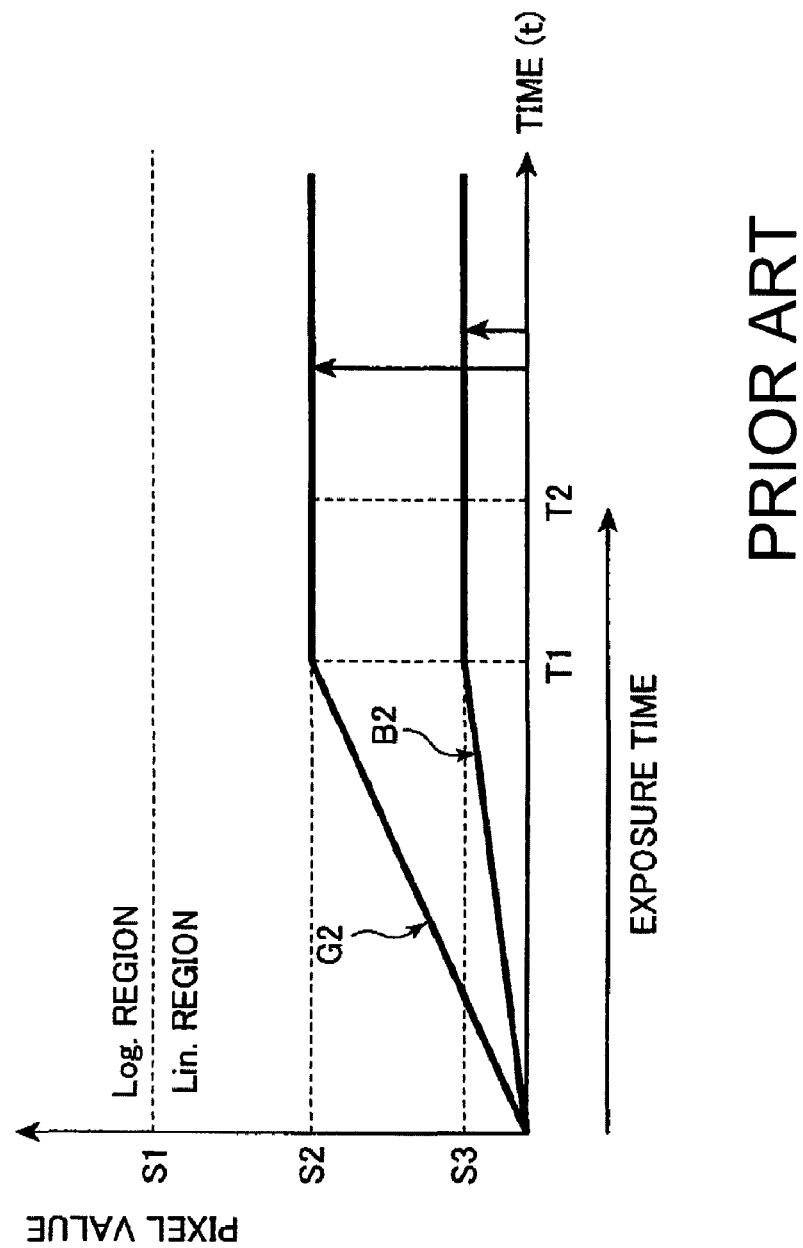
FIG. 18 is a graph for explaining another problem of the prior art arrangement.
Figure 19:
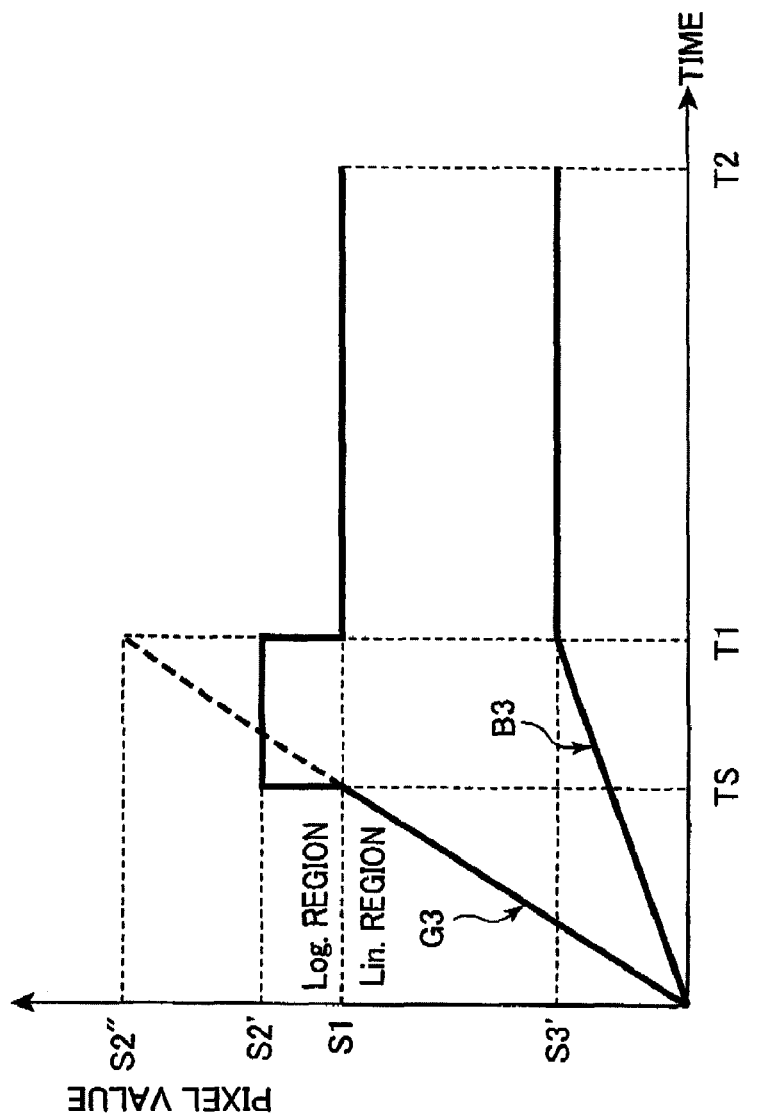
FIG. 19 is a graph for explaining the problem of the prior art arrangement.

FIG. 15 is a graph showing pixel value tracings (solid lines) of the same pixel values obtained through the first linear conversion process as shown by solid lines in FIG. 14 and pixel value tracings (broken lines) obtained by converting the pixel values obtained through the second linear conversion process shown by the alternate long and short dashed lines in FIG. 14 into pixel values expected to be obtained through the first linear conversion process, in which horizontal and vertical axes represent the subject brightness and the pixel value, respectively. As shown in FIG. 15, when the pixel values obtained through the second linear conversion process are converted into the pixel values expected to be obtained through the first linear conversion process, the pixel value tracings obtained are lines produced by extending straight line segments of the pixel value tracings obtained through the first linear conversion process by specific amounts. It will be appreciated from the pixel value tracings of FIG. 15 that the second linear conversion process offers a wider dynamic range than the first linear conversion process.

It is possible to prevent or reduce color fringing caused by differences in the sensitivities of the individual pixels and, in particular, color fringing caused by a change in the subject brightness by performing the image sensing operation in a manner similar to the first and second embodiments even when the image sensing operation is accomplished through the first and second linear conversion processes.

While the first and second embodiments have been described with particular attention given to the pixels provided with the green (G) color filters and the pixels provided with the red (R) color filters, the particular attention need not necessarily be given to these pixels. In an image sensor having pixels provided with RGB color filters, the pixels provided with the red (R) color filters perform generally the same photoelectric conversion operation as the pixels provided with the blue (B) color filters. In addition, the present invention is applicable also to an image sensing apparatus including an image sensor having pixels provided with cyan (C), magenta (M) and yellow (Y) color filters.

While the present Specification has thus far described various arrangements of the invention with reference to the preferred embodiments and variations thereof, principal arrangements and features of the invention are summarized hereinbelow.

In one aspect of the invention, an image sensing apparatus comprises a color image sensor configured to perform a first exposure operation for processing incident light by using a first photoelectric conversion property and a second exposure operation for processing the incident light by using a second photoelectric conversion property differing from the first photoelectric conversion property, the color image sensor having capability to separately output first and second output signals obtained by the first and second exposure operations, respectively, a correction coefficient calculator for calculating correction coefficients used for correcting white balance of the first and second output signals, a processor for selecting output signals to be used as signals for constituting an image from among the first and second output signals for individual color components thereof based on a comparison between the level of each of the first and second output signals and one of threshold values, and a threshold setter for setting the threshold values for the individual color components according to the correction coefficients.

In another aspect of the invention, an image sensing method comprises the steps of causing a color image sensor to perform a first exposure operation for processing incident light by using a first photoelectric conversion property and a second exposure operation for processing the incident light by using a second photoelectric conversion property differing from the first photoelectric conversion property and to output first and second output signals obtained by the first and second exposure operations, respectively, calculating correction coefficients used for correcting white balance of the first and second output signals, selecting output signals to be used as signals for constituting an image from among the first and second output signals for individual color components thereof based on a comparison between the level of each of the first and second output signals and one of threshold values, and setting the threshold values for the individual color components according to the correction coefficients.

According to the image sensing apparatus and the image sensing method thus configured, the first output signals are obtained by the first exposure operation of the color image sensor and the second output signals are obtained by the second exposure operation of the color image sensor. When the first and second output signals are thus obtained, the correction coefficient calculator calculates the correction coefficients used for correcting white balance of the individual output signals, and the threshold setter sets the threshold values for the individual color components according to the correction coefficients with respect to the level of each of the first and second output signals. Then, the processor compares the level of each of the first and second output signals and one of threshold values and selects the output signals to be used as signals for constituting an image from among the first and second output signals according to the result of comparison. Accordingly, it is possible to obtain an image having white balance faithfully reproducing a true subject.

In another aspect of the invention, the threshold setter calculates the threshold values for the other color components by using a preset threshold value preset for a predetermined one of the color components and the correction coefficients, and the processor selects the output signals to be used as the signals for constituting the image from among the first and second output signals for the individual color components by comparing the level of each of the first and second output signals and one of the threshold values for the color components corresponding to the pertinent output signals.

In another aspect of the invention, the image sensing apparatus further comprises a white balance corrector for correcting the white balance of the first and second output signals by using the correction coefficients, wherein the processor selects the output signals to be used as the signals for constituting the image from among the first and second output signals for the individual color components by comparing the level of each of the first and second output signals and a threshold value preset for a predetermined one of the color components.

In another aspect of the invention, the processor compares the levels of the first and second output signals with the threshold values for the color components corresponding to the respective output signals and, if the comparison of plural signal levels with the threshold values produce contradictory results, the processor selects output signals corresponding to the threshold values set for the individual color components as the signals for constituting the image without selecting either of the first and second output signals.

According to the image sensing apparatus thus configured, it is possible to obtain an image having white balance faithfully reproducing a true subject even if a change in subject brightness occurs.

In still another aspect of the invention, the aforementioned predetermined one of the color components is a color component to which the color image sensor is most sensitive among all the color components.

This arrangement makes it possible to facilitate processing performed by the processor.

In another aspect of the invention, the first exposure operation is an exposure process in which the color image sensor is set to a linear conversion property to produce output signals having output values proportional to an accumulated amount of the incident light from the beginning of exposure, and the second exposure operation is an exposure process in which the color image sensor is set to a logarithmic conversion property to produce output signals having output values obtained by logarithmically compressing the amount of the incident light.

This arrangement is particularly effective for an image sensing apparatus configured to perform a first exposure operation which is an exposure process in which a color image sensor is set to a linear conversion property to produce output signals having output values proportional to an accumulated amount of the incident light from the beginning of exposure and a second exposure operation which is an exposure process in which the color image sensor is set to a logarithmic conversion property to produce output signals having output values obtained by logarithmically compressing the amount of the incident light.

In yet another aspect of the invention, the first exposure operation is an exposure process in which the color image sensor is set to a first linear conversion property to produce output signals having output values proportional to an accumulated amount of the incident light from the beginning of exposure, and the second exposure operation is an exposure process in which the color image sensor is set to a second linear conversion property to produce output signals having output values proportional to the accumulated amount of the incident light from the beginning of exposure obtained by using a constant of proportionality different from that for the first linear conversion property.

This arrangement is particularly effective for an image sensing apparatus configured to perform a first exposure operation which is an exposure process in which a color image sensor is set to a first linear conversion property to produce output signals having output values proportional to an accumulated amount of the incident light from the beginning of exposure and a second exposure operation which is an exposure process in which the color image sensor is set to a second linear conversion property to produce output signals having output values proportional to the accumulated amount of the incident light from the beginning of exposure obtained by using a constant of proportionality different from that for the first linear conversion property.

In another important feature of the invention, an image sensing apparatus comprises a color image sensor configured to perform a first exposure operation for processing incident light by using a first photoelectric conversion property and a second exposure operation for processing the incident light by using a second photoelectric conversion property differing from the first photoelectric conversion property, the color image sensor having capability to separately output first and second output signals obtained by the first and second exposure operations, respectively, a correction coefficient calculator for calculating correction coefficients from the first and second output signals used for correcting white balance thereof, a processor for selecting output signals to be used as signals for constituting an image from among the first and second output signals for individual color components thereof based on a comparison between the level of each of the first and second output signals and one of threshold values, and a threshold setter for setting the threshold values for the individual color components based on the first and second output signals.

According to the image sensing apparatus thus configured, it is possible to obtain an image having white balance faithfully reproducing a true subject.

While the present invention has thus far been described properly and sufficiently through a discussion of the illustrative embodiments with reference to the drawings, it should be recognized that modifications and/or improvements of the embodiments can easily be done by those skilled in the art. It should therefore be construed that such modifications and/or improvements fall within metes and bounds of the claims as long as the modifications and/or improvements do not constitute a departure from the spirit and scope of the claims.

What is claimed is:

1. An image sensing apparatus comprising:
   a color image sensor configured to perform a first exposure operation for processing incident light by using a first photoelectric conversion property and a second exposure operation for processing the incident light by using a second photoelectric conversion property differing from the first photoelectric conversion property, said color image sensor having capability to separately output first and second output signals obtained by the first and second exposure operations, respectively;

a correction coefficient calculator for calculating correction coefficients used for correcting white balance of the first and second output signals;

a processor for selecting output signals to be used as signals for constituting an image from among the first and second output signals for individual color components thereof based on a comparison between the level of each of the first and second output signals and one of threshold values; and a threshold setter for setting the threshold values for the individual color components according to the correction coefficients.

2. The image sensing apparatus according to claim 1, wherein said threshold setter calculates the threshold values for the other color components by using a preset threshold value preset for a predetermined one of the color components and the correction coefficients, and said processor selects the output signals to be used as the signals for constituting the image from among the first and second output signals for the individual color components by comparing the level of each of the first and second output signals and one of the threshold values for the color components corresponding to the pertinent output signals.

3. The image sensing apparatus according to claim 1 further comprising:
a white balance corrector for correcting the white balance of the first and second output signals by using the correction coefficients;
wherein said processor selects the output signals to be used as the signals for constituting the image from among the first and second output signals for the individual color components by comparing the level of each of the first and second output signals and a threshold value preset for a predetermined one of the color components.

4. The image sensing apparatus according to claim 1, wherein said processor compares the levels of the first and second output signals with the threshold values for the color components corresponding to the respective output signals and, if the comparison of plural signal levels with the threshold values produce contradictory results, said processor selects output signals corresponding to the threshold values set for the individual color components as the signals for constituting the image without selecting either of the first and second output signals.

5. The image sensing apparatus according to claim 2, wherein said predetermined one of the color components is a color component to which said color image sensor is most sensitive among all the color components.

6. The image sensing apparatus according to claim 1, wherein said first exposure operation is an exposure process in which said color image sensor is set to a linear conversion property to produce output signals having output values proportional to an accumulated amount of the incident light from the beginning of exposure, and said second exposure operation is an exposure process in which said color image sensor is set to a logarithmic conversion property to produce output signals having output values obtained by logarithmically compressing the amount of the incident light.

7. The image sensing apparatus according to claim 1, wherein said first exposure operation is an exposure process in which said color image sensor is set to a first linear conversion property to produce output signals having output values proportional to an accumulated amount of the incident light from the beginning of exposure, and said second exposure operation is an exposure process in which said color image sensor is set to a second linear conversion property to produce output signals having output values proportional to the accumulated amount of the incident light from the beginning of exposure obtained by using a constant of proportionality different from that for the first linear conversion property.

8. An image sensing apparatus comprising:
a color image sensor configured to perform a first exposure operation for processing incident light by using a first photoelectric conversion property and a second exposure operation for processing the incident light by using a second photoelectric conversion property differing from the first photoelectric conversion property, said color image sensor having capability to separately output first and second output signals obtained by the first and second exposure operations, respectively;
a correction coefficient calculator for calculating correction coefficients from the first and second output signals used for correcting white balance thereof;
a processor for selecting output signals to be used as signals for constituting an image from among the first and second output signals for individual color components thereof based on a comparison between the level of each of the first and second output signals and one of threshold values; and
a threshold setter for setting the threshold values for the individual color components based on the first and second output signals.

9. An image sensing method comprising the steps of:
causing a color image sensor to perform a first exposure operation for processing incident light by using a first photoelectric conversion property and a second exposure operation for processing the incident light by using a second photoelectric conversion property differing from the first photoelectric conversion property and to output first and second output signals obtained by the first and second exposure operations, respectively;
calculating correction coefficients used for correcting white balance of the first and second output signals;
selecting output signals to be used as signals for constituting an image from among the first and second output signals for individual color components thereof based on a comparison between the level of each of the first and second output signals and one of threshold values; and
setting the threshold values for the individual color components according to the correction coefficients.

10. The image sensing method according to claim 9, wherein said step of setting the threshold values includes using a threshold value preset for a predetermined one of the color components and calculating the threshold values for the other color components by using the preset threshold value and the correction coefficients, and said step of selecting includes selecting the output signals to be used as the signals for constituting the image from among the first and second output signals for the individual color components by comparing the level of each of the first and second output signals and one of the threshold values for the color components corresponding to the pertinent output signals.

11. The image sensing method according to claim 9 further comprising the step of:
correcting the white balance of the first and second output signals by using the correction coefficients;
wherein said step of selecting includes selecting the output signals to be used as the signals for constituting the image from among the first and second output signals for the individual color components by comparing the level of each of the first and second output signals and a threshold value preset for a predetermined one of the color components.

12. The image sensing method according to claim 9, wherein said step of selecting includes comparing the levels of the first and second output signals with the threshold values for the color components corresponding to the respective output signals and, if the comparison of plural signal levels with the threshold values produce contradictory results, selecting output signals corresponding to the threshold values set for the individual color components as the signals for constituting the image without selecting either of the first and second output signals.

13. The image sensing method according to claim 10, wherein said predetermined one of the color components is a color component to which said color image sensor is most sensitive among all the color components.

14. The image sensing method according to claim 9, wherein said first exposure operation is an exposure process in which a linear conversion property is selected to produce output signals having output values proportional to an accumulated amount of the incident light from the beginning of exposure, and said second exposure operation is an exposure process in which a logarithmic conversion property is selected to produce output signals having output values obtained by logarithmically compressing the amount of the incident light.

15. The image sensing method according to claim 9, wherein said first exposure operation is an exposure process in which a first linear conversion property is selected to produce output signals having output values proportional to an accumulated amount of the incident light from the beginning of exposure, and said second exposure operation is an exposure process in which a second linear conversion property is selected to produce output signals having output values proportional to the accumulated amount of the incident light from the beginning of exposure obtained by using a constant of proportionality different from that for the first linear conversion property.

* * * * *